（12） United States Patent
Yang et al.

(10) Patent No.: US 9,130,068 B2
(45) Date of Patent: Sep. 8, 2015

(54) LIGHT EMITTING DEVICES HAVING DISLOCATION DENSITY MAINTAINING BUFFER LAYERS

(71) Applicant: Manutius IP, Inc., Los Altos, CA (US)

(72) Inventors: Long Yang, Union City, CA (US); Will Fenwick, Livermore, CA (US)

(73) Assignee: Manutius IP, Inc., Los Altos, CA (US)

( * ) Notice: Subject to any disclaimer, the term of this patent is extended or adjusted under 35 U.S.C. 154(b) by 0 days.

(21) Appl. No.: 14/158,401

(22) Filed: Jan. 17, 2014

(65) Prior Publication Data

US 2014/0134775 A1 May 15, 2014

Related U.S. Application Data

(63) Continuation of application No. 13/249,157, filed on Sep. 29, 2011, now abandoned.

(51) Int. Cl.
*H01L 21/00* (2006.01)
*H01L 33/00* (2010.01)
*H01L 33/12* (2010.01)
*H01L 21/02* (2006.01)
*H01L 33/02* (2010.01)

(52) U.S. Cl.
CPC .......... *H01L 33/007* (2013.01); *H01L 21/0254* (2013.01); *H01L 21/0262* (2013.01); *H01L 21/02381* (2013.01); *H01L 21/02458* (2013.01); *H01L 21/02505* (2013.01); *H01L 33/025* (2013.01); *H01L 33/12* (2013.01); *H01L 2924/0002* (2013.01)

(58) Field of Classification Search
CPC .............. H01L 33/00; H01L 21/02381; H01L 21/02458; H01L 21/02505; H01L 21/0254; H01L 21/0262; H01L 33/007; H01L 33/025; H01L 33/12; H01L 2924/0002; H01L 2924/00
USPC ............... 438/29–47, 22, 478, 167, 172, 590, 438/602–604
See application file for complete search history.

(56) References Cited

U.S. PATENT DOCUMENTS 5,306,662 A   4/1994   Nakamura et al.
5,408,120 A   4/1995   Manabe et al.
(Continued)

FOREIGN PATENT DOCUMENTS

JP   2626431 B2   7/1997
JP   2666237 B2   10/1997
(Continued)

OTHER PUBLICATIONS

International Search Report, WO2013049417, Apr. 4, 2013, Corresponding PCT application.
(Continued)

*Primary Examiner* — Thanh T Nguyen
(74) *Attorney, Agent, or Firm* — Norton Rose Fulbright US LLP

(57) ABSTRACT

A method for forming a light emitting device comprises forming a buffer layer having a plurality of layers comprising a substrate, an aluminum gallium nitride layer adjacent to the substrate, and a gallium nitride layer adjacent to the aluminum gallium nitride layer. During the formation of each of the plurality of layers, one or more process parameters are selected such that an individual layer of the plurality of layers is strained.

25 Claims, 6 Drawing Sheets

(56) References Cited

U.S. PATENT DOCUMENTS

| | | | |
|---|---|---|---|
| 5,432,808 A | 7/1995 | Hatano et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,766,783 A | 6/1998 | Utsumi et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| 6,045,626 A | 4/2000 | Yano et al. |
| RE36,747 E | 6/2000 | Manabe et al. |
| 6,121,635 A | 9/2000 | Watanabe et al. |
| 6,215,133 B1 | 4/2001 | Nakamura et al. |
| 6,236,061 B1 | 5/2001 | Walpita |
| 6,242,764 B1 | 6/2001 | Ohba et al. |
| 6,265,726 B1 | 7/2001 | Manabe et al. |
| 6,326,236 B1 | 12/2001 | Koide et al. |
| 6,420,733 B2 | 7/2002 | Koide et al. |
| 6,441,403 B1 | 8/2002 | Chang et al. |
| 6,469,324 B1 | 10/2002 | Wang |
| 6,541,293 B2 | 4/2003 | Koide et al. |
| 6,589,808 B2 * | 7/2003 | Chiyo et al. .................. 438/46 |
| 6,610,995 B2 | 8/2003 | Nakamura et al. |
| 6,611,002 B2 | 8/2003 | Weeks et al. |
| 6,617,060 B2 | 9/2003 | Weeks, Jr. et al. |
| 6,649,287 B2 | 11/2003 | Weeks, Jr. et al. |
| 6,657,236 B1 | 12/2003 | Thibeault et al. |
| 6,784,462 B2 | 8/2004 | Schubert |
| 6,800,500 B2 | 10/2004 | Coman et al. |
| 6,822,270 B2 | 11/2004 | Koide et al. |
| 6,838,693 B2 | 1/2005 | Kozaki |
| 6,849,881 B1 | 2/2005 | Harle et al. |
| 6,890,791 B2 | 5/2005 | Ohtsuka et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,001,791 B2 | 2/2006 | Kryliouk et al. |
| 7,026,653 B2 | 4/2006 | Sun |
| 7,071,498 B2 | 7/2006 | Johnson et al. |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,148,517 B2 | 12/2006 | Tu et al. |
| 7,154,121 B2 | 12/2006 | Hsieh et al. |
| 7,193,246 B1 | 3/2007 | Tanizawa et al. |
| 7,247,889 B2 | 7/2007 | Hanson et al. |
| 7,247,985 B2 | 7/2007 | Kaneko et al. |
| 7,262,436 B2 | 8/2007 | Kondoh et al. |
| 7,312,474 B2 | 12/2007 | Emerson et al. |
| 7,322,732 B2 | 1/2008 | Negley et al. |
| 7,323,764 B2 | 1/2008 | Wallis |
| 7,326,967 B2 | 2/2008 | Hsieh et al. |
| 7,327,036 B2 | 2/2008 | Borghs et al. |
| 7,335,920 B2 | 2/2008 | Denbaars et al. |
| 7,339,205 B2 | 3/2008 | Piner et al. |
| 7,345,297 B2 | 3/2008 | Yamazoe et al. |
| 7,348,602 B2 | 3/2008 | Tanizawa |
| 7,368,759 B2 * | 5/2008 | Arai et al. ................... 257/103 |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,547,925 B2 | 6/2009 | Wong et al. |
| 7,598,108 B2 | 10/2009 | Li et al. |
| 7,611,917 B2 | 11/2009 | Emerson et al. |
| 7,615,420 B2 | 11/2009 | Jiang et al. |
| 7,674,639 B2 | 3/2010 | Lester |
| 7,687,827 B2 | 3/2010 | Piner et al. |
| 7,691,651 B2 | 4/2010 | Park |
| 7,709,851 B2 | 5/2010 | Bader et al. |
| 7,737,459 B2 | 6/2010 | Edmond et al. |
| 7,754,514 B2 | 7/2010 | Yajima et al. |
| 7,781,356 B2 | 8/2010 | Kouvetakis et al. |
| 7,791,061 B2 | 9/2010 | Edmond et al. |
| 7,791,101 B2 | 9/2010 | Bergmann et al. |
| 7,791,106 B2 | 9/2010 | Piner et al. |
| 7,795,623 B2 | 9/2010 | Emerson et al. |
| 7,813,400 B2 | 10/2010 | Denbaars et al. |
| 7,821,024 B2 | 10/2010 | Jeong |
| 7,910,945 B2 | 3/2011 | Donofrio et al. |
| 7,928,471 B2 | 4/2011 | Mastro et al. |
| 7,939,844 B2 | 5/2011 | Hahn et al. |
| 7,947,994 B2 | 5/2011 | Tanizawa et al. |
| 7,968,865 B2 | 6/2011 | Laroche et al. |
| 8,021,904 B2 | 9/2011 | Chitnis |
| 8,030,665 B2 | 10/2011 | Nagahama et al. |
| 8,183,669 B2 | 5/2012 | Ishibashi et al. |
| 8,232,557 B2 | 7/2012 | Makabe et al. |
| 8,728,841 B2 | 5/2014 | Oh et al. |
| 2002/0020850 A1 * | 2/2002 | Shibata et al. ................ 257/183 |
| 2002/0158253 A1 | 10/2002 | Moku et al. |
| 2003/0178642 A1 | 9/2003 | Tanaka et al. |
| 2004/0221799 A1 | 11/2004 | Nakayama et al. |
| 2005/0106849 A1 | 5/2005 | Gwo |
| 2006/0006500 A1 | 1/2006 | Piner et al. |
| 2006/0121682 A1 | 6/2006 | Saxler |
| 2006/0249741 A1 | 11/2006 | Wang |
| 2007/0114511 A1 | 5/2007 | Kim et al. |
| 2007/0210304 A1 | 9/2007 | Komiyama et al. |
| 2007/0295985 A1 | 12/2007 | Weeks et al. |
| 2008/0200013 A1 | 8/2008 | Piner et al. |
| 2008/0261403 A1 | 10/2008 | Wang et al. |
| 2009/0008647 A1 | 1/2009 | Li et al. |
| 2009/0152578 A1 | 6/2009 | Lee |
| 2009/0261363 A1 | 10/2009 | Chen et al. |
| 2009/0313640 A1 * | 12/2009 | Liang et al. .................. 719/318 |
| 2009/0321780 A1 | 12/2009 | Huang et al. |
| 2010/0019263 A1 | 1/2010 | Yeh et al. |
| 2010/0038669 A1 | 2/2010 | McKenzie |
| 2010/0166983 A1 | 7/2010 | Cho et al. |
| 2010/0176369 A2 | 7/2010 | Oliver et al. |
| 2010/0187497 A1 * | 7/2010 | Nago et al. ...................... 257/13 |
| 2010/0207097 A1 | 8/2010 | Oh et al. |
| 2011/0003420 A1 | 1/2011 | Chen et al. |
| 2011/0012155 A1 | 1/2011 | Huang et al. |
| 2011/0049546 A1 | 3/2011 | Heikman et al. |
| 2011/0309327 A1 * | 12/2011 | Jeong ............................. 257/13 |
| 2011/0318857 A1 * | 12/2011 | Lee ................................ 438/37 |
| 2012/0061643 A1 * | 3/2012 | Enya et al. ..................... 257/13 |
| 2013/0082236 A1 | 4/2013 | Ramer et al. |
| 2013/0082273 A1 | 4/2013 | Ting |
| 2013/0082280 A1 | 4/2013 | Lin et al. |
| 2013/0082290 A1 | 4/2013 | Yan et al. |
| 2013/0200432 A1 * | 8/2013 | Stau et al. .................... 257/183 |

FOREIGN PATENT DOCUMENTS

| | | | |
|---|---|---|---|
| JP | 2681733 B2 | 11/1997 |
| JP | 2735057 B2 | 4/1998 |
| JP | 2778405 B2 | 7/1998 |
| JP | 2785254 B2 | 8/1998 |
| JP | 2803741 B2 | 9/1998 |
| JP | 2827794 B2 | 11/1998 |
| JP | 2890396 B2 | 5/1999 |
| JP | 2917742 B2 | 7/1999 |
| JP | 2956489 B2 | 10/1999 |
| JP | 3063756 B1 | 7/2000 |
| JP | 3063757 B1 | 7/2000 |
| JP | 3100644 B2 | 10/2000 |
| JP | 3135041 B2 | 2/2001 |
| JP | 3209096 B2 | 9/2001 |
| JP | 3223832 B2 | 10/2001 |
| JP | 3250438 B2 | 1/2002 |
| JP | 3304787 B2 | 7/2002 |
| JP | 3314666 B2 | 8/2002 |
| JP | 3332127 B2 | 10/2002 |
| JP | 3344257 B2 | 11/2002 |

(56) References Cited

FOREIGN PATENT DOCUMENTS

| JP | 3374737 | B2 | 2/2003 |
|---|---|---|---|
| JP | 3424629 | B2 | 7/2003 |
| JP | 3427265 | B2 | 7/2003 |
| JP | 2003234501 | A | 8/2003 |
| JP | 3505357 | B2 | 3/2004 |
| JP | 3506874 | B2 | 3/2004 |
| JP | 3511970 | B2 | 3/2004 |
| JP | 3548442 | B2 | 7/2004 |
| JP | 3551101 | B2 | 8/2004 |
| JP | 2004349387 | A | 12/2004 |
| JP | 3622562 | B2 | 2/2005 |
| JP | 3646649 | B2 | 5/2005 |
| JP | 3654738 | B2 | 6/2005 |
| JP | 2005251922 | A | 9/2005 |
| JP | 3748011 | B2 | 2/2006 |
| JP | 3780887 | B2 | 5/2006 |
| JP | 3786114 | B2 | 6/2006 |
| JP | 3795624 | B2 | 7/2006 |
| JP | 3890930 | B2 | 3/2007 |
| JP | 2008103665 | A | 5/2008 |
| JP | 4118370 | B2 | 7/2008 |
| JP | 4118371 | B2 | 7/2008 |
| JP | 2008166349 | A | 7/2008 |
| JP | 2009231814 | A | 10/2009 |
| JP | 2010153838 | A | 7/2010 |
| JP | WO2010150809 | | 12/2010 |
| JP | 4629178 | B2 | 2/2011 |
| JP | 4860024 | B2 | 1/2012 |
| JP | 4904261 | B2 | 3/2012 |

OTHER PUBLICATIONS

Office action dated Feb. 27, 2013 for U.S. Appl. No. 13/249,146.
Office action dated Dec. 17, 2012 for U.S. Appl. No. 13/248,821.
Bae, et al. Surface Investigation of a Cubic AlN Buffer Layer and GaN Grown on Si(111) and Si(100) as Revealed by Atomic Force Microscopy. Journal of the Korean Physical Society, vol. 49, No. 3, Sep. 2006, pp. 1092-1096.
Cooke, M. High-Brightness Nitride LEDs on Silicon Through Wafer Bonding. Available at http://www.semiconductor-today.com/news_items/2011/June/KOREAPHOTONICS_040611.html. Accessed Nov. 8, 2011.
Dadgar, et al. Epitaxy of GaN on silicon-impact of symmetry and surface reconstruction. New Journal of Physics, vol. 9, No. 389 (2007); IOP Publishing Ltd., http://iopscience.iop.org/1367-2630/9/10/389.
Zang, et al. Structural analysis of metalorganic chemical vapor deposited AlN nucleation layers on Si(111). Singapore-MIT Alliance, Jan. 2004, citable URI; http://hdl.handle.net/1721.1/3841 (4 pages).
Arslan, et al. Buffer optimization for crack-free GaN epitaxial layers grown on Si(111) substrate by MOCVD. J. Phys. D: Appl. Phys. 2008; 41:155317-1-10.
Hageman, et al. Growth of GaN epilayers on Si(111) substrates using multiple buffer layers. Mat. Res. Soc. Symp. Proc. 2002; 693:1-6.
Hang, et al. Influence of an Advanced Buffer Layer on the Optical Properties of an InGaN/GaN MQW Grown on a (111) Silicon Substrate. J. Kor. Phys. Soc. Mar. 2007; 50(3):797-800.
Hangleiter, et al. Suppression of Nonradiative Recombination by V-Shaped Pits in GaInN/GaN Quantum Wells Produces a Large Increase in the Light Emission Efficiency. PRL. 2005; 95(12):127402-1-127402-4.
Hao, et al. Highly efficient GaN-based light emitting diodes with micropits. Appl. Phys. Letts. 2006; 89:241907-1-241907-3.
Hsu, et al. Crack-Free High-Brightness InGaN/GaN LEDs on Si(111) with Initial AlGaN Buffer and Two LT-Al Interlayers. J. Elec. Soc. 2007; 154:H191-H193.
Kim, et al. Light Extraction in GaInN Light-Emitting Diodes using Diffuse Omnidirectional Reflectors. J. Elec. Soc. 2006; 153(2):G105-G107.
Lee, et al. High brightness GaN-based light-emitting diodes. J. Display Tech. Jun. 2007; 3(2):118-125.
Li, et al. Growth of III-nitride photonic structures on large area silicon substrates. Appl. Phys. Letts. 2006; 88:171909-1-3.
Liang, et al. Synthesis and characterization of heteroepitaxial GaN films on Si(111). Vacuum. 2010; 84:1154-1158.
Lin, et al. Growth of GaN film on 150 mm Si (111) using multilayer AlN/AlGaN buffer by metal-organic vapor phase epitaxy method. Appl. Phys. Letts. 2007; 91:222111-1-3.
Pal, et al. Silicon a new substrate for GaN growth. Bull. Mater. Sci. Dec. 2004; 27(6):501-504.
Xi, et al. High Light-Extraction Efficiency in GaInN Light-Emitting Diode with Pyramid Reflector. Proc. of SPIE. 2007; 6486:648606-1-8.
Xiang, et al. High quality GaN epilayers grown on Si (111) with thin nonlinearly composition-graded $Al_xGa_{1-x}N$ interlayers via metal-organic chemical vapor deposition. Journal of Alloys and Compounds. 2011; 509:2227-2231.
Zhu, et al. GaN-based LEDs grown on 6-inch diameter Si (111) substrates by MOVPE. Proc. of SPIE. 2006; 7231:723118-1-11.
Office Action issued from the Japanese Patent Office for Application No. 2014-504089, dated Oct. 14, 2014; 8 pages with English language translation.

* cited by examiner

LIGHT EMITTING DEVICES HAVING DISLOCATION DENSITY MAINTAINING BUFFER LAYERS

RELATED APPLICATIONS

This application is a continuation of and claims priority to U.S. patent application Ser. No. 13/249,157 filed Sep. 29, 2011, the contents of which are herein incorporated by reference in its entirety.

BACKGROUND

Lighting applications typically use incandescent or gas-filled bulbs. Such bulbs typically do not have long operating lifetimes and thus require frequent replacement. Gas-filled tubes, such as fluorescent or neon tubes, may have longer lifetimes, but operate using high voltages and are relatively expensive. Further, both bulbs and gas-filled tubes consume substantial amounts of energy.

A light emitting diode (LED) is a device that emits light upon the recombination of electrons and holes. An LED typically includes a chip of semiconducting material doped with impurities to create a p-n junction. Current flows from the p-side, or anode, to the n-side, or cathode. Charge-carriers—electrons and holes—flow into the p-n junction from electrodes with different voltages. When an electron meets a hole, the electron recombines with the hole in a process that may result in the radiative emission of energy in the form of a photon (hv). The photons, or light, are transmitted out of the LED and employed for use in various applications, such as, for example, lighting applications and electronics applications.

LED's, in contrast to incandescent or gas-filled bulbs, are relatively inexpensive, operate at low voltages, and have long operating lifetimes. Additionally, LED's consume relatively little power and are compact. These attributes make LED's particularly desirable and well suited for many applications.

Despite the advantages of LED's, there are limitations associated with such devices. Such limitations include materials limitations, which may limit the efficiency of LED's; structural limitations, which may limit transmission of light generated by an LED out of the device; and manufacturing limitations, which may lead to high processing costs. Accordingly, there is a need for improved LED's and methods for manufacturing LED's.

SUMMARY

In an aspect, light emitting devices, such as light emitting diodes (LED's), are provided. In an embodiment, a light emitting device comprises a buffer layer comprising an aluminum gallium nitride layer and a gallium nitride (GaN) layer adjacent to the aluminum gallium nitride layer. The light emitting device further comprises a light emitting stack adjacent to the buffer layer, the light emitting stack having an active layer configured to generate light upon the recombination of electrons and holes, wherein a combined thickness of the buffer layer and the light emitting stack is less than or equal to 5 micrometers (µm). In some cases, the buffer layer includes an aluminum nitride (AlN) layer. The AlN layer can be adjacent to the aluminum gallium nitride layer. In some situations, the AlN layer is between a substrate, such as a silicon substrate, and the aluminum gallium nitride layer.

In another embodiment, a light emitting device comprises a buffer layer having an aluminum nitride (AlN) layer, an aluminum gallium nitride layer adjacent to the AlN layer, and a gallium nitride (GaN) layer adjacent to the aluminum gallium nitride layer; and a light emitting stack adjacent to the GaN layer. The light emitting stack includes an active layer configured to generate light upon the recombination of electrons and holes. An absolute value of a radius of curvature of the buffer layer is greater than 50 m.

In another embodiment, a light emitting device comprises a buffer layer comprising i) a tensile strained aluminum nitride (AlN) layer, ii) a compressive strained $Al_xGa_{1-x}N$ layer adjacent to the AlN layer, wherein 'x' is a number between 0 and 1, and iii) a compressive strained gallium nitride (GaN) layer adjacent to the strained $Al_xGa_{1-x}N$ layer. The light emitting device further comprises a light emitting stack adjacent to the buffer layer. The light emitting stack includes an n-type gallium nitride (n-GaN) layer, a p-type gallium nitride (p-GaN) layer, and an active layer between the n-GaN and p-GaN layers. The active layer configured to generate light upon the recombination of electrons and holes.

In another embodiment, a light emitting device comprises a buffer layer adjacent to a light emitting stack. The light emitting stack includes an active layer configured to generate light upon the recombination of electrons and holes. The active layer includes an n-type gallium nitride layer and a p-type gallium nitride layer. The buffer layer has a radius of curvature (absolute value) that is greater than 50 m.

In another aspect, methods for forming light emitting devices are provided. In an embodiment, a method for forming a light emitting device comprises forming, over a substrate in a reaction chamber, a light emitting stack having an active layer configured to generate light upon the recombination of electrons and holes. The light emitting stack is formed adjacent to a gallium nitride (GaN) layer that is, in turn, formed adjacent to an aluminum gallium nitride layer under processing conditions that form defects in the GaN layer. The aluminum gallium nitride layer is formed adjacent to an aluminum nitride (AlN) layer under processing conditions that form defects in the aluminum gallium nitride layer. The AlN layer is formed adjacent to the substrate under processing conditions that form defects in the AlN layer.

In another embodiment, a method for forming a light emitting device comprises providing a substrate in a reaction chamber and forming an aluminum nitride (AlN) layer adjacent to the substrate under processing conditions selected to generate defects in the AlN layer. An aluminum gallium nitride layer is formed adjacent to the AlN layer under processing conditions selected to generate defects in the aluminum gallium nitride layer. A gallium nitride (GaN) layer is formed adjacent to the aluminum gallium nitride layer under processing conditions selected to generate defects in the GaN layer.

In another embodiment, a method for forming a light emitting device comprises forming a plurality of layers adjacent to a substrate. The plurality of layers include i) an aluminum nitride layer adjacent to the substrate, ii) an aluminum gallium nitride layer adjacent to the aluminum nitride layer and iii) a gallium nitride layer adjacent to the aluminum gallium nitride layer. During the formation of each of the plurality of layers, one or more process parameters are selected such that an individual layer of the plurality of layers has a strain that is nonzero with increasing thickness of the individual layer.

In another embodiment, a method for forming a light emitting device comprises forming, over a substrate in a reaction chamber (or reaction space if the reaction chamber includes a plurality of reaction spaces), a light emitting stack having an n-type gallium nitride (n-GaN) layer, a p-type gallium nitride (p-GaN) layer and an active layer between the n-GaN layer and the p-GaN layer. The active layer is configured to generate light upon the recombination of electrons and holes. The light emitting stack is formed adjacent to a gallium nitride (GaN) layer. The GaN layer is formed adjacent to an aluminum gallium nitride layer, the aluminum gallium nitride is formed adjacent to an aluminum nitride layer, and the AlN layer is formed adjacent to the substrate. The substrate in some cases is a silicon substrate.

In some cases, during the formation of one or more of the GaN layer, aluminum gallium nitride layer and the AlN layer, processing conditions are selected to generate defects (or strain-inducing defects) in one or more of the GaN layer, aluminum gallium nitride layer and the AlN layer. In some cases, during the formation of the GaN layer, aluminum gallium nitride layer and the AlN layer, processing conditions are selected to generate defects in each of the GaN layer, aluminum gallium nitride layer and the AlN layer. Processing conditions in some cases are selected to maintain a predetermined density of defects in the layers. In some situations, the predetermined defect density is between about $1 \times 10^8$ cm$^{-2}$ and $2 \times 10^{10}$ cm$^{-2}$. In some embodiments, processing conditions are selected such that at a growth temperature between about 800° C. and 1200° C., or between about 900° C. and 1100° C., each of the GaN layer, aluminum gallium nitride layer and the AlN layer has a non-zero tensile or compressive strain with increasing thickness of the layer.

In another embodiment, a method for forming a light emitting device comprises providing a substrate in a reaction chamber, and forming an aluminum nitride (AlN) layer adjacent to the substrate under processing conditions selected to generate strain in the AlN layer. An aluminum gallium nitride layer is formed adjacent to the AlN layer under processing conditions selected to generate strain in the aluminum gallium nitride layer. A gallium nitride (GaN) layer is formed adjacent to the aluminum gallium nitride layer under processing conditions selected to generate strain in the GaN layer.

In another aspect, systems for forming light emitting devices are provided. In an embodiment, a system for forming a light emitting device comprises a reaction chamber for holding a substrate and a pumping system in fluid communication with the reaction chamber, the pumping system configured to purge or evacuate the reaction chamber. The system includes a computer system having a processor for executing machine readable code implementing a method for forming a buffer layer adjacent to the substrate. The method comprises forming a plurality of layers adjacent to the substrate, the plurality of layers including i) an aluminum nitride layer adjacent to the substrate, ii) an aluminum gallium nitride layer adjacent to the aluminum nitride layer and iii) a gallium nitride layer adjacent to the aluminum gallium nitride layer. During the formation of each of the plurality of layers, one or more process parameters are selected such that an individual layer of the plurality of layers has a strain that is nonzero with increasing thickness of the individual layer.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION

Figure 1:
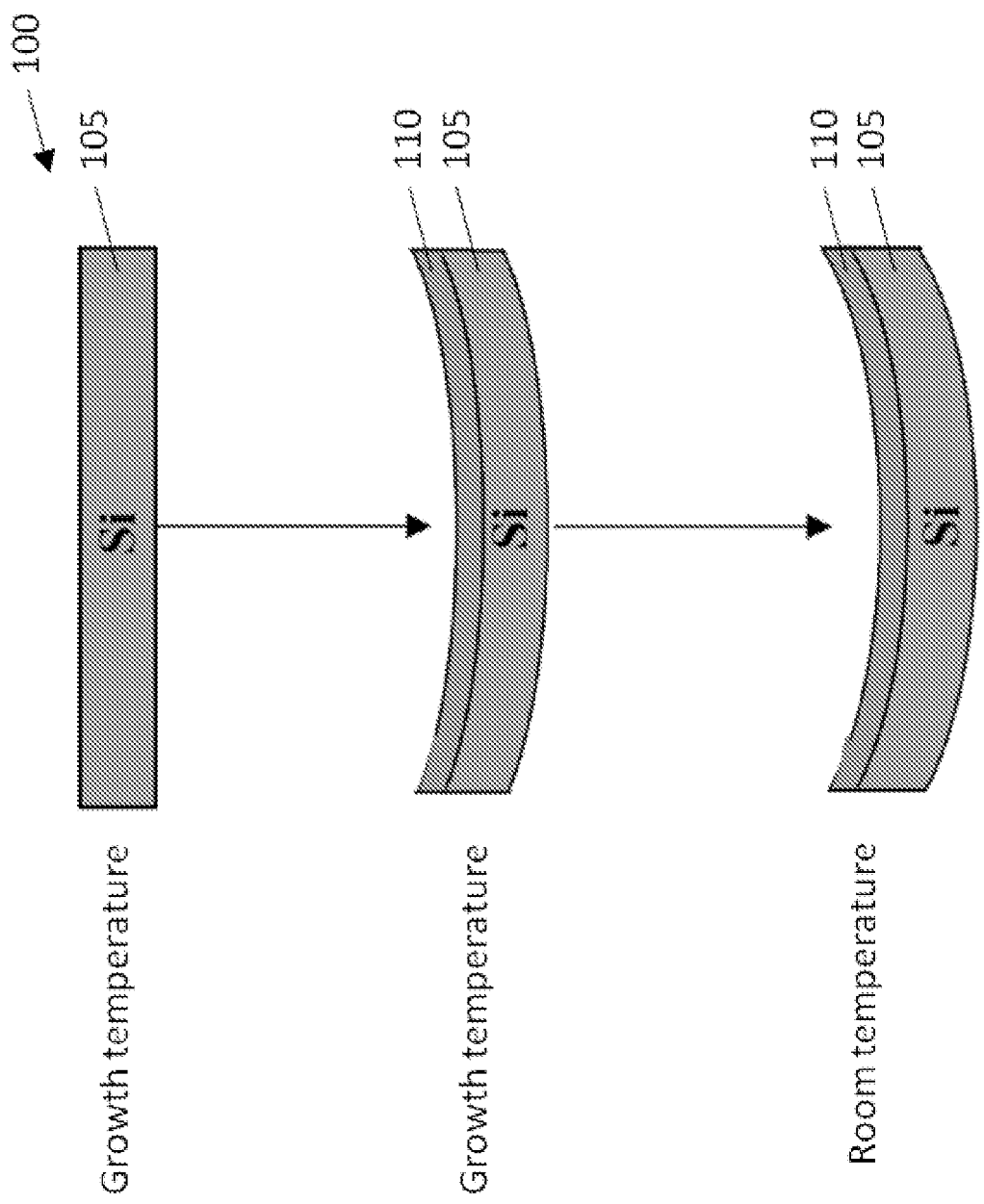
FIG. 1 schematically illustrates a nascent light emitting device.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

The term "light emitting device," as used herein, refers to a device configured to generate light upon the recombination of electrons and holes in a light emitting region (or "active layer") of the device, such as upon the application (or flow) of a forward-biasing electrical current through the light emitting region. A light emitting device in some cases is a solid state device that converts electrical energy to light. A light emitting diode ("LED") is a light emitting device. There are many different LED device structures that are made of different materials and have different structures and perform in a variety of ways. Some light emitting devices (laser diodes) emit laser light, and others generate non-monochromatic light. Some LED's are optimized for performance in particular applications. An LED may be a so-called blue LED comprising a multiple quantum well (MQW) active layer having indium gallium nitride. A blue LED may emit non-monochromatic light having a wavelength in a range from about 440 nanometers to 500 nanometers. A phosphor coating may be provided that absorbs some of the emitted blue light. The phosphor in turn fluoresces to emit light of other wavelengths so that the light the overall LED device emits has a wider range of wavelengths.

The term "layer," as used herein, refers to a layer of atoms or molecules on a substrate. In some cases, a layer includes an epitaxial layer or a plurality of epitaxial layers. A layer may include a film or thin film. In some situations, a layer is a structural component of a device (e.g., light emitting diode) serving a predetermined device function, such as, for example, an active layer that is configured to generate (or emit) light. A layer generally has a thickness from about one monoatomic monolayer (ML) to tens of monolayers, hundreds of monolayers, thousands of monolayers, millions of monolayers, billions of monolayers, trillions of monolayers, or more. In an example, a layer is a multilayer structure having a thickness greater than one monoatomic monolayer. In addition, a layer may include multiple material layers (or sub-layers). In an example, a multiple quantum well active layer includes multiple well and barrier layers. A layer may include a plurality of sub-layers. For example, an active layer may include a barrier sub-layer and a well sub-layer.

The term "coverage," as used herein, refers to the fraction of a surface covered or occupied by a species in relation to the total area of the surface. For example, a coverage of 10% for a species indicates that 10% of a surface is covered by the species. In some situations, coverage is represented by monolayers (ML), with 1 ML corresponding to complete saturation of a surface with a particular species. For example, a pit coverage of 0.1 ML indicates that 10% of a surface is occupied by pits.

The term "active region" (or "active layer"), as used herein, refers to a light emitting region of a light emitting diode (LED) that is configured to generate light. An active layer comprises an active material that generates light upon the recombination of electrons and holes, such as, for example, with the aid of a forward-biasing electrical current through the active layer. An active layer may include one or a plurality of layers (or sub-layers). In some cases, an active layer includes one or more barrier layers (or cladding layers, such as, e.g., GaN) and one or more quantum well ("well") layers (such as, e.g., InGaN). In an example, an active layer comprises multiple quantum wells, in which case the active layer may be referred to as a multiple quantum well ("MQW") active layer.

The term "doped," as used herein, refers to a structure or layer that is chemically doped. A layer may be doped with an n-type chemical dopant (also "n-doped" herein) or a p-type chemical dopant (also "p-doped" herein). In some cases, a layer is undoped or unintentionally doped (also "u-doped" or "u-type" herein). In an example, a u-GaN (or u-type GaN) layer includes undoped or unintentionally doped GaN.

The term "Group III-V semiconductor," as used herein, refers to a material having one or more Group III species and one or more Group V species. A Group III-V semiconductor material in some cases is selected from gallium nitride (GaN), gallium arsenide (GaAs), aluminum gallium arsenide (AlGaAs), gallium arsenide phosphide (GaAsP), aluminum gallium indium phosphide (AlGaInP), gallium phosphide (GaP), indium gallium nitride (InGaN), aluminum gallium phosphide (AlGaP), aluminum nitride (AlN), aluminum gallium nitride (AlGaN), and aluminum gallium indium nitride (AlGaInN).

The term "dopant," as used herein, refers to a chemical dopant, such as an n-type dopant or a p-type dopant. P-type dopants include, without limitation, magnesium, beryllium, zinc and carbon. N-type dopants include, without limitation, silicon, germanium, tin, tellurium, and selenium. A p-type semiconductor is a semiconductor that is doped with a p-type dopant. An n-type semiconductor is a semiconductor that is doped with an n-type dopant. An n-type Group III-V material, such as n-type gallium nitride ("n-GaN"), includes a Group III-V material that is doped with an n-type dopant. A p-type Group III-V material, such as p-type GaN ("p-GaN"), includes a Group III-V material that is doped with a p-type dopant. A Group III-V material includes at least one Group III element selected from boron, aluminum, gallium, indium, and thallium, and at least one Group V element selected from nitrogen, phosphorus, arsenic, antimony and bismuth.

The term "adjacent" or "adjacent," as used herein, includes 'next to', 'adjoining', 'in contact with', and 'in proximity to'. In some instances, adjacent components are separated from one another by one or more intervening layers. For example, the one or more intervening layers can have a thickness less than about 10 micrometers ("microns"), 1 micron, 500 nanometers ("nm"), 100 nm, 50 nm, 10 nm, 1 nm, or less. In an example, a first layer is adjacent to a second layer when the first layer is in direct contact with the second layer. In another example, a first layer is adjacent to a second layer when the first layer is separated from the second layer by a third layer.

The term "substrate," as used herein, refers to any workpiece on which film or thin film formation is desired. A substrate includes, without limitation, silicon, germanium, silica, sapphire, zinc oxide, carbon (e.g., graphene), SiC, AlN, GaN, spinel, coated silicon, silicon on oxide, silicon carbide on oxide, glass, gallium nitride, indium nitride, titanium dioxide, aluminum nitride, a ceramic material (e.g., alumina, AlN), a metallic material (e.g., molybdenum, tungsten, copper, aluminum), and combinations (or alloys) thereof.

The term "injection efficiency," as used herein, refers to the proportion of electrons passing through a light emitting device that are injected into the active region of the light emitting device.

The term "internal quantum efficiency," as used herein, refers to the proportion of all electron-hole recombination events in an active region of a light emitting device that are radiative (i.e., producing photons).

The term "extraction efficiency," as used herein, refers to the proportion of photons generated in an active region of a light emitting device that escape from the device.

The term "external quantum efficiency" (EQE), as used herein, refers to the ratio of the number of photons emitted from an LED to the number of electrons passing through the LED. That is, EQE=Injection efficiency×Internal quantum efficiency×Extraction efficiency.

While silicon provides various advantages, such as the ability to use semiconductor fabrication, the formation of Group III-V semiconductor based LED's on a silicon substrate poses various limitations. As an example, the lattice mismatch and coefficient of thermal expansion between silicon and gallium nitride leads to structural stresses that generate defects upon the formation of gallium nitride thin films, such as threading and/or hairpin dislocations (collectively "dislocations" herein).

LED's may be formed of various semiconductor device layers. In some situations, Group III-V semiconductor LED's offer device parameters (e.g., wavelength of light, external quantum efficiency) that may be preferable over other semiconductor materials. Gallium nitride (GaN) is a binary Group III-V direct bandgap semiconductor that may be used in optoelectronic applications and high-power and high-frequency devices.

Group III-V semiconductor based LED's may be formed on various substrates, such as silicon, germanium and sapphire. Silicon provides various advantages over certain other substrates, such as the capability of using current manufacturing and processing techniques, in addition to using large wafer sizes that aid in maximizing the number of LED's formed within a predetermined period of time. However, while silicon provides various advantages, recognized herein are various limitations and difficulties associated with forming Group III-V semiconductor-based LED's (such as gallium nitride-based LED's) on silicon.

One issue is the formation of a gallium and silicon alloy, which may be undesirable in circumstances in which high quality GaN is desired. In some situations, at a temperature greater than about 1000° C., the growth of high quality GaN may be difficult due to the formation of a silicon-gallium alloy at an interface between a gallium nitride device layer and the silicon substrate. Another issue associated with forming Group III-V semiconductor-based LED's on silicon is the lattice mismatch and the mismatch in coefficient of thermal expansion (CTE) between gallium nitride and silicon, which may generate structural stresses that may lead to cracking issues in LED devices. Cracking of various device layers of a light emitting device (e.g., LED) may yield poor device performance and limit the lifetime of the light emitting device.

In an example, for an LED having a GaN epitaxial layer (also "epilayer" herein) on a silicon substrate, the stress in the epilayer increases with increasing thickness in the GaN epilayer. The increase in stress may lead to the silicon wafer to bow and in some cases crack. The cracking issue may be more severe for a GaN layer that is n-doped with silicon, due at least in part to a high tensile strain in silicon-doped GaN. While the thickness of the silicon-doped GaN layer may be selected to avoid cracking, such thickness limitations may impose performance limitations for GaN and silicon-based LED devices.

In some cases, following the formation of a GaN thin film on a silicon substrate at an elevated growth temperature, during cool down the silicon substrate contracts at a lower rate than the GaN thin film, at least partly because GaN has a higher coefficient of thermal expansion than silicon. Under such circumstances, at room temperature the GaN thin film is under tensile strain. Conversely, GaN has a lower coefficient of thermal expansion than sapphire ($Al_2O_3$). As a consequence, for a GaN thin film grown on a sapphire substrate, following thin film formation and cool down to room temperature, the GaN thin film is under compressive strain. For GaN thin films formed on silicon and GaN thin films formed on sapphire, the differences in lattice constants between GaN and silicon and sapphire imposes tensile strain on GaN thin films at room temperature. For GaN formed on sapphire, the tensile strain due to the mismatch in lattice constants is counterbalanced by the compressive strain due to mismatch in coefficient of thermal expansion between GaN and sapphire, preventing GaN thin films on from cracking. For GaN formed on silicon, on the other hand, the tensile strain due to the mismatch in coefficient of thermal expansion and mismatch in lattice constant generate tensile strain at room temperature, which typically leads to the GaN thin film to bow and in some cases crack at room temperature. At least in some situations, this provides a disincentive for forming LED's having GaN thin films on silicon substrates.

In an example, FIG. 1 schematically illustrates simplified cross-sectional views showing the formation of a light emitting device 100 having silicon substrate 105 and a GaN thin film 110 formed thereon. The light emitting device 100 in some cases is a nascent light emitting device; additional processing operations may be required to form a completed light emitting device. The silicon substrate 105 is heated to a growth temperature, as illustrated in the top view of FIG. 1. At the growth temperature, the GaN film 110 is formed on the silicon substrate 105, which causes the silicon substrate 105 and the GaN film 110 to bow, as illustrated in the middle view of FIG. 1. After the GaN film 110 is formed on the silicon substrate 105, the structure is allowed to cool down to room temperature. However, the stress produced by the GaN film 110 on the substrate 105 leaves a bow on the structure, as illustrated in the lower of view of FIG. 1.

In some cases, the GaN film 110 is formed on a monocrystalline (or single crystal) substrate, such as Si(111), in which case the GaN film 110 is an epilayer. Due to the mismatch of coefficient of thermal expansion between the silicon substrate 105 and the GaN thin film 110, at the growth temperature the GaN thin film 110 is under tensile strain, leading the GaN thin film 110 and the silicon substrate 105 to bow. At the growth temperature, the GaN thin film 110 and the silicon substrate 105 are bowed by an angle θ in relation to an axis parallel to a bottom surface of the silicon substrate 105. The angle θ is greater than 0°. The GaN thin film 110 and the silicon substrate 105 have a concave configuration in relation to the axis. The mismatch in lattice constants between GaN and silicon leads to additional tensile strain. In such a case, upon cooldown to room temperature, the GaN thin film 110 is under tensile strain, which may lead to cracking in various device layers of the light emitting device 100.

In some cases, the bowing and cracking issues in GaN thin films on silicon substrates may be addressed by minimizing the defect density of GaN thin film during formation. This helps provide low defect density, high quality GaN thin films on silicon substrates. However, the formation of low defect density GaN thin films on silicon substrates has posed manufacturing challenges.

Structures, devices and methods described in various embodiments of the invention help address the issues described above in regards to the formation of GaN thin films on silicon substrates. In some embodiments, structures and methods are provided to reduce the strain in GaN thin films formed on silicon substrates. This minimizes, if not eliminates, bowing and cracking of GaN thin films on silicon substrates following cool down from a growth temperature to room temperature.

Structures, devices and methods are based, at least in part, on the unexpected realization that any tensile strain in a GaN thin film on a silicon substrate—due, for example, to the mismatch in coefficient of thermal expansion)—may be counterbalanced by an opposing strain generated in the GaN thin film. The opposing strain in some cases is a compressive strain. In some embodiments, a GaN-containing buffer layer having on a silicon substrate is strained at a growth temperature to have compressive strain, which may balance the tensile strain in the GaN-containing buffer layer, thereby minimizing, if not eliminating bowing and crack formation.

In some embodiments, various device layers of a light emitting device are formed by introducing or maintaining dislocations in the various device layers. The dislocations, which may give rise to V-pits (or V-defects) under unique (or otherwise predetermined) growth conditions, help maintain strain (compressive or tensile) in each of the various device layers at the growth temperature. In some embodiments, device layers of a light emitting device are formed over a silicon substrate to have a predetermined dislocation density in order to generate a compressive strain at the growth temperature that balances the tensile strain in the device layers.

As device layers grow in thickness, dislocations may decrease. For instance, with increasing thickness of a device layer on silicon, the density of dislocations decreases with increasing thickness of the device layer. In some embodiments, the thickness of the device layers, such as a buffer layer (including the various layers of the buffer layer), is selected to maintain a predetermined dislocation density in the device layers at the growth temperature. That is, certain device layers are formed to have a thickness that provides a predetermined dislocation density. In an example, a device layer is formed at a thickness selected to maintain a dislocation density between about $1 \times 10^8$ $cm^{-2}$ and $2 \times 10^{10}$ $cm^{-2}$.

In some embodiments, dislocations have at least two functions. One function is to balance stresses in the various layers of the light emitting device. Another function is to generate V-pits (or V-defects) in the light emitting device. The active layer may be formed in the V-pits during the formation of the light emitting device.

Light Emitting Devices and Buffer Layers

An aspect of the invention provides light emitting devices, such as light emitting diodes. In some embodiments, a light emitting device comprises a plurality of layers formed on a silicon substrate. In some cases, the plurality of layers include a buffer layer. One or more of the plurality of layers are strained. In some cases, one or more of the plurality of layers are intentionally strained—e.g., during the formation of the plurality of layers, processing conditions are selected to generate strain in the plurality of layers, such as by way of defects. In some embodiments, the strain generates a compressive strain that balances any tensile strain—due, for example, to the mismatch in coefficient of thermal expansion between the silicon substrate and overlying device layers—in the light emitting device, which provides a light emitting device that has little to no net strain at room temperature.

In some embodiments, the buffer layer is compressively strained at a growth temperature. Upon cool down from the growth temperature (such as, for example, to room temperature), the compressive strain balances the tensile strain in the buffer layer.

In some embodiments, one or more layers of the light emitting device are strained with the aid of dislocations formed in the one or more layers during growth. The dislocations aid in maintaining (or generating) strain in the one or more layers at a growth temperature and upon cool-down from the growth temperature.

In some embodiments, a light emitting device includes a buffer layer formed on a silicon substrate and a light emitting stack formed on the buffer layer. The light emitting stack includes a light emitting active layer. The buffer layer is strained to have a net compressive strain that balances any tensile strain in the buffer layer. This provides a buffer layer having little to no overall strain at room temperature.

At room temperature, the light emitting device may be concave, flat or substantially flat. In cases in which the light emitting device is concave, the substrate bends toward the buffer layer. In some embodiments, the light emitting device has a radius of curvature (absolute value) that is greater than about 30 meters ("m"), or 40 m, or 50 m, or 100 m, or 200 m, or 300 m, or 400 m, or 500 m, or 1000 m, or 10,000 m. In some cases, the radius of curvature (or degree of bowing) is substantially zero or less than zero (i.e., the substrate and various device layers are convex). In some situations, the light emitting device has a radius of curvature (degree of bowing) that is less than about −50 m, or −100 m, or −200 m, or −300 m, or −400 m, or −500 m, or −1000 m, or −10,000 m.

Figure 5:
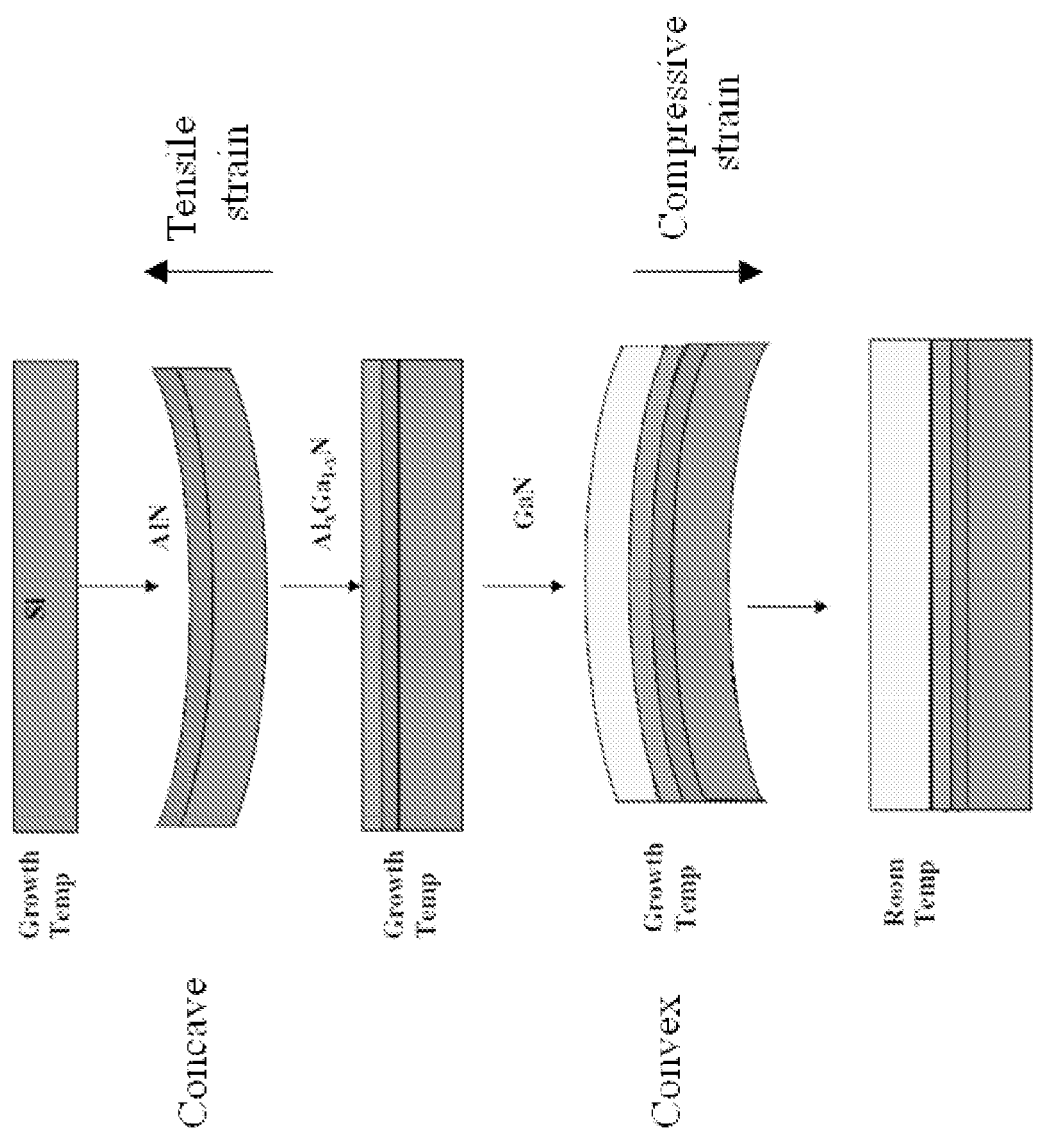
FIG. 5 shows simplified cross-sectional side views at various stages of a process for forming a buffer layer of a nascent light emitting device over a silicon substrate, in accordance with an embodiment.

At a growth temperature, the light emitting device may be convex—i.e., the substrate bends away from the buffer layer (see FIG. 5). In some embodiments, at the growth temperature the light emitting device has a radius of curvature (absolute value) that is greater than about 3 m, or 4 m, or 5 m, or 6 m, or 7 m, or 8 m, or 9 m, or 10 m, or 15 m, or 20 m, or 25 m, or 30 m, or 35 m, or 40 m, or 45 m. In some embodiments, at the growth temperature the light emitting device has a radius of curvature (absolute value) that is between about 0.1 m and 50 m, or 0.5 m and 20 m, or 1 m and 6 m. The radius of curvature at the growth temperature may be predetermined by regulating one or more growth conditions (see below).

The radius of curvature may be calculated by calculating the degree to which light directed to a surface scatters, such as, for example, with the aid of a deflectometer. By measuring the scattering of light during device layer formation, any change in strain may be calculated. The radius of curvature is inversely proportional to the strain—the more strained a layer, the lower the radius of curvature; conversely, the less strained a layer, the higher the radius of curvature. In the case of a substantially flat surface (i.e., little to no bowing), the radius of curvature approaches infinity.

In some embodiments, one or more layers of a light emitting device are strained at a growth temperature. The growth temperature is elevated in relation to room temperature. The strain at the elevated growth temperature aids in balancing any opposing strain (e.g., compressive strain) at the elevated growth temperature. In such a case, upon cool down to room temperature, the one or more layers of the light emitting device have little to no strain, which advantageously minimizes, if not eliminates bowing and, in some cases, the formation of cracks.

In some embodiments, a light emitting device comprises a buffer layer adjacent to a light emitting stack. The buffer layer comprises a strained aluminum nitride (AlN) layer, a strained $Al_xGa_{1-x}N$ (wherein 'x' is a number between 0 and 1) layer adjacent to the AlN layer, and a strained gallium nitride (GaN) layer adjacent to the strained $Al_xGa_{1-x}N$ layer. In some situations, the strained AlN layer may be precluded. The light emitting stack comprises an n-type gallium nitride (n-GaN) layer, a p-type gallium nitride (p-GaN) layer, and an active layer between the n-GaN and p-GaN layers. The active layer is configured to generate light upon the recombination of electrons and holes, such as upon the application of a forward-biasing electrical current through the active layer. In some cases, the n-GaN layer is adjacent to the strained GaN layer. The n-GaN layer is configured to aid in the flow of electrical current to the active layer. The p-GaN layer is configured to aid in the flow of holes to the active layer.

In some situations, the buffer layer of the light emitting device has at most one AlN layer, at most one $Al_xGa_{1-x}N$ layer adjacent to the at most one AlN layer, and at most one GaN adjacent to the at most one $Al_xGa_{1-x}N$ layer. In an example, the light emitting device has one AlN layer, one $Al_xGa_{1-x}N$ layer adjacent to the AlN layer, and one GaN layer adjacent to the $Al_xGa_{1-x}N$ layer. The light emitting device in such a case does not include any additional AlN layers, $Al_xGa_{1-x}N$ layers, and GaN layers.

In some cases, the light emitting device include one or more additional strained aluminum gallium nitride layers between the strained $Al_xGa_{1-x}N$ layer and the strained GaN layer. In some embodiments, the light emitting device includes a strained $Al_yGa_{1-y}N$ layer (wherein 'y' is a number between 0 and 1) between the $Al_xGa_{1-x}N$ layer and the strained GaN layer. The strained $Al_yGa_{1-y}N$ layer may be compositionally graded between the composition of an outermost sub-layer of the strained $Al_xGa_{1-x}N$ layer (adjacent to the strained $Al_yGa_{1-y}N$ layer) and the internationally strained GaN layer.

The light emitting device further includes a substrate adjacent to the buffer layer or the light emitting stack. In some cases, the substrate is adjacent to the buffer layer. In an example, the substrate is adjacent to the AlN layer of the buffer layer. In other cases, the substrate is adjacent to the light emitting stack, such as adjacent to the p-GaN layer of the light emitting stack. The substrate includes one or more of silicon, germanium, silicon oxide, silicon dioxide, titanium oxide, titanium dioxide, sapphire, silicon carbide (SiC), a ceramic material (e.g., alumina, AlN) and a metallic material (e.g., molybdenum, tungsten, copper, aluminum).

In some embodiments, a thickness of a light emitting device is selected to generate and/or maintain a predetermined defect density (e.g., dislocation density) in the light emitting device, including the buffer layer of the light emitting device. The defects in turn induce strain (e.g., compressive or tensile strain). The defect density in some cases can be a function of the thickness of the buffer layer. In an example, the thicker the buffer layer, the lower the defect density, and the thinner the buffer layer, the higher the defect density. Devices described in certain embodiments are based on the unexpected realization that by carefully selecting the thickness of individual layers of the light emitting device and the growth conditions, various issues describe above, such as cracking upon cool-down to room temperature, may be mitigated, if not eliminated.

In some embodiments, a thickness of the light emitting device is less than or equal to about 5 micrometers ("µm"), or less than or equal to about 4 µm, or less than or equal to about 3 µm. In some embodiments, a combined thickness of the buffer layer and the light emitting stack is less than or equal to about 5 micrometers ("µm"), or less than or equal to about 4 µm, or less than or equal to about 3 µm. In some embodiments, a thickness of the strained AlN layer is less than or equal to about 1 µm, or less than or equal to about 0.5 µm, or less than or equal to about 0.4 µm. In some embodiments, a thickness of the strained $Al_xGa_{1-x}N$ layer is less than or equal to about 1 µm, or less than or equal to about 0.8 µm, or less than or equal to about 0.7 µm. In some embodiments, a thickness of the strained GaN layer is less than or equal to about 4 µm, or less than or equal to about 3 µm, or less than or equal to about 2.5 µm. In some embodiments, a thickness of the buffer layer is less than or equal to about 5 µm, or less than or equal to about 4 µm, or less than or equal to about 3 µm.

Various layers of the light emitting device are strained during growth by having a predetermined density of defects. In some embodiments, the strained AlN layer has a defect density (e.g., dislocation density) between about $1 \times 10^8$ cm$^{-2}$ and $2 \times 10^{10}$ cm$^{-2}$, the strained $Al_xGa_{1-x}N$ layer has a defect density between about $1 \times 10^8$ cm$^{-2}$ and $2 \times 10^{10}$ cm$^{-2}$, and the strained GaN layer has a defect density between about $1 \times 10^8$ cm$^{-2}$ and $2 \times 10^{10}$ cm$^{-2}$. In some cases, the light emitting stack has a defect density between about $1 \times 10^8$ cm$^{-2}$ and $2 \times 10^{10}$ cm$^{-2}$.

In some embodiments, the dislocation density of the strained GaN layer is less than those of the strained AlGaN and AlN layers. The dislocation density of the strained AlGaN layer may be less than the dislocation density of the AlN layer. In some situations, the addition of a new material during the growth of the buffer layer is accompanied by a release of strain for the first 10-150 monolayers of the layer.

In some cases, the buffer layer has a dislocation density between about $1 \times 10^8$ cm$^{-2}$ and $2 \times 10^{10}$ cm$^{-2}$, which facilitates in the formation of V-defects (or V-pits) in the GaN layer and the LED layers. In such cases, straining the buffer layer—including AlN, $Al_xGa_{1-x}N$ and GaN layers of the buffer layer—by maintaining a density of dislocations facilitates the formation of V-defects in the buffer layer and the LED layers. By selecting one or more growth conditions, the size of V-defect can be controlled. Furthermore, the active region, where the light is generated, can be grown selectively only at the areas between V-defects. This is an effective way to grow high-efficiency LED materials. The selective growth of the active layer, thus, tolerates the existing of dislocations which, then, is utilized to engineer the stress of the overall grown layers.

In some embodiment, the light emitting device includes additional layers. In some cases, the light emitting device includes an electron blocking layer between the active layer and the p-GaN layer. In some embodiment, the light emitting device include a first electrode in electrical communication with the n-GaN layer and a second electrode in electrical communication with the p-GaN layer. The light emitting device may include a layer of an optically reflective material (also "optical reflector" herein) adjacent to the p-GaN layer. The layer of the optically reflective material may be formed of one or more of silver, platinum, gold and nickel, rhodium and indium.

Figure 2:
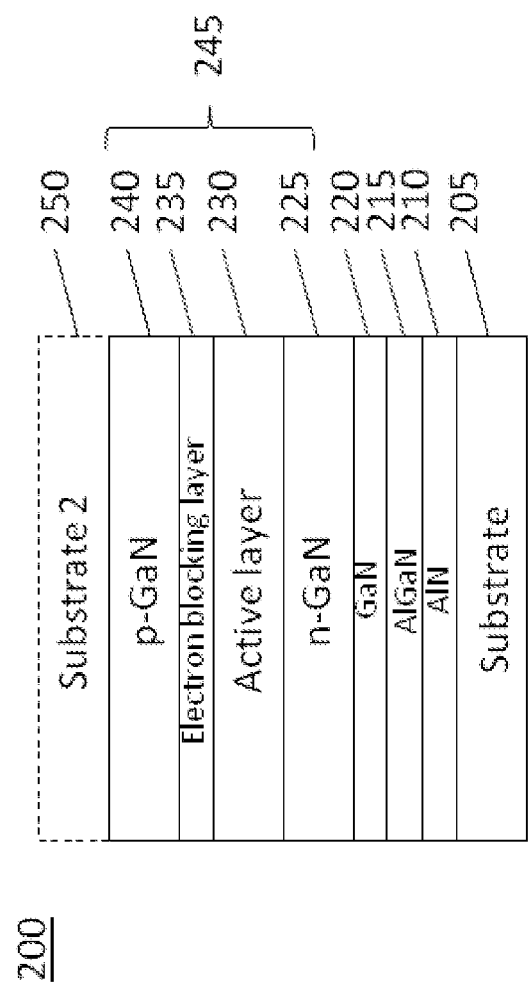
FIG. 2 schematically illustrates a cross section of a light emitting diode, in accordance with an embodiment.

FIG. 2 shows an LED 200, in accordance with an embodiment. The LED 200 comprises a first substrate 205, an AlN layer 210 adjacent to the first substrate 205, an AlGaN layer 215 adjacent to the AlN layer 210, a GaN layer 220 adjacent to the AlGaN layer 215, an n-type GaN ("n-GaN") layer 225 adjacent to the GaN layer 220, an active layer 230 adjacent to the n-GaN layer 225, an electron blocking (e.g., AlGaN) layer 235 adjacent to the active layer 230, and a p-type GaN ("p-GaN") layer 240 adjacent to the electron blocking layer 235.

The GaN layer 220 may be formed of u-GaN (i.e., undoped or unintentionally doped GaN). The AlN layer 210, AlGaN layer 215 and GaN layer 220, in some cases, at least partly define a buffer layer of the LED 200. The n-GaN layer 225, active layer 230, and p-GaN layer 240 define a light emitting stack 245 of the LED 200. The light emitting sack 245 may include other layers, such as the electron blocking layer 235. The electron blocking layer 235 is configured to minimize the recombination of electrons with holes in the p-GaN layer 240.

The first substrate 205 may be formed of silicon. In some situations, the LED 200 includes a second substrate 250 (Substrate 2) adjacent to the p-GaN layer 240. In such a case, the first substrate 205 may be precluded. The second substrate 250 may be included in the final LED 200.

In some embodiments, the AlN layer 210, AlGaN layer 215 and the GaN layer 220 are strained layers. In some cases, the AlN layer 210 is under tensile strain, the AlGaN layer 215 is under compressive strain and the GaN layer 220 is under compressive strain.

The AlGaN layer 215 may have an aluminum and gallium composition selected to effect desirable (or predetermined) device properties. In some cases, the aluminum and gallium composition is selected to generate strain in the AlGaN layer 215. The AlGaN layer 215 may have the formula $Al_xGa_{1-x}N$, wherein 'x' is a number between 0 and 1. In some situations, the AlGaN layer 215 is compositionally graded in aluminum and gallium. In an example, at the interface between the AlN layer 210 and the AlGaN layer 215, the aluminum content of the AlGaN layer 215 is greater than the gallium content (i.e., x>1-x), and at the interface between the AlGaN layer 215 and the GaN layer 220, the gallium content of the AlGaN layer 215 is greater than the aluminum content (i.e., 1-x>x). In another example, at the interface between the AlN layer 210 and the AlGaN layer 215, the aluminum content of the AlGaN layer 215 is less than the gallium content (i.e., x<1-x), and at the interface between the AlGaN layer 215 and the GaN layer 220, the gallium content of the AlGaN layer 215 is greater than the aluminum content (i.e., 1-x>x).

In some embodiments, the AlN layer 210 has a defect density between about $1 \times 10^8$ cm$^{-2}$ and $2 \times 10^{10}$ cm$^{-2}$, the AlGaN layer 215 has a defect density between about $1 \times 10^8$ cm$^{-2}$ and $2 \times 10^{10}$ cm$^{-2}$, and the GaN layer 220 has a defect density between about $1 \times 10^8$ cm$^{-2}$ and $2 \times 10^{10}$ cm$^{-2}$. In some cases, the light emitting stack 245 has a defect density between about $1 \times 10^8$ cm$^{-2}$ and $2 \times 10^{10}$ cm$^{-2}$.

The LED 200 may include a first electrode in electrical communication with the n-GaN layer 225 and a second electrode in electrical communication with the p-GaN layer 240. In some cases, the first electrode is in electrical contact with the n-GaN layer 225. The second electrode may be in electrical contact with the p-GaN layer 240.

In some cases, The LED 200 includes a layer of an optically reflective material adjacent to the p-GaN layer. In an example, the Led 200 includes layer of an optically reflective material (e.g., silver) between the p-GaN layer 240 and the second substrate 250.

Methods for Formula Light Emitting Devices

Another aspect of the invention provides methods for forming light emitting devices, such as light emitting diodes. In some embodiments, methods for forming a light emitting device comprise forming a barrier layer adjacent to a substrate, the barrier layer including i) an aluminum nitride (AlN) layer adjacent to the silicon substrate, ii) an aluminum gallium nitride layer adjacent to the AlN layer, and iii) a gallium nitride (GaN) layer adjacent to the aluminum gallium nitride layer. In some embodiments, during the formation of the barrier layer, one or more process parameters are selected such that an individual layer of the barrier layer has a tensile strain or compressive strain that is nonzero with increasing thickness of the layer. The tensile strain and compressive strain in the barrier layer can be adjusted such that the barrier layer has a net compressive strain at a growth temperature.

The strain (compressive or tensile) in device layers (e.g., AlN layer, aluminum gallium nitride layer, GaN layer) of the light emitting device may be at least partially dependent on the defect density in the device layers. In some embodiments, during the formation of the barrier layer, one or more process parameters are selected such that an individual layer of the barrier layer has a predetermined concentration of defects (e.g., dislocations). In some situations process parameters are selected such that an individual layer of the barrier layer has a defect density between about $1 \times 10^8$ cm$^{-2}$ and $2 \times 10^{10}$ cm$^{-2}$.

In some embodiments, the substrate is formed of a material including silicon, germanium, silicon oxide, silicon dioxide, titanium oxide, titanium dioxide, sapphire, silicon carbide (SiC), a ceramic material and a metallic material. In some implementations, the substrate is formed of silicon.

Process parameters (or growth conditions) are adjustable based upon the selection of one or more process parameters for forming a light emitting device. Growth conditions may include growth temperature, carrier gas flow rate, precursor flow rate, growth rate, reaction chamber pressure and susceptor (or platten) rotation rate.

In some embodiments, one or more layers of a light emitting device are formed at a growth temperature between about 750° C. and 1200° C., or between about 900° C. and 1100° C. Individual layers may be formed at growth temperatures selected to effect a predetermined defect density.

In some cases, during the formation of one or more of the GaN layer, aluminum gallium nitride layer and the AlN layer, processing conditions are selected to generate defects in one or more of the GaN layer, aluminum gallium nitride layer and the AlN layer. In some cases, during the formation of the GaN layer, aluminum gallium nitride layer and the AlN layer, processing conditions are selected to generate defects in the GaN layer, aluminum gallium nitride layer and the AlN layer. The defects aid in maintaining a predetermined level of strain in the layers at the growth temperature.

In an embodiment, the AlN layer is formed under growth conditions selected to generate tensile strain in the AlN layer. In another embodiment, the aluminum gallium nitride layer is formed under growth conditions selected to generate compressive strain in the aluminum gallium nitride layer. In another embodiment, the GaN layer is formed under growth conditions selected to generate compressive strain in the GaN layer.

In some embodiments, various device layers, such as a buffer layer, are under tensile strain or compressive strain by virtue of defects (e.g., dislocations). Process conditions are selected to form a layer having a predetermined defect density. In an example, an AlN layer is formed under process conditions selected such that the AlN layer is under tensile strain due at least in part to defects in the AlN layer. The AlN layer in some cases is under tensile strain at a growth temperature that is elevated with respect to the tensile strain it exhibits at room temperature. The density of defects is selected to generate a predetermined level of tensile strain. In some cases, the defect density is between about $1 \times 10^8$ cm$^{-2}$ and $2 \times 10^{10}$ cm$^{-2}$. In other examples, an aluminum gallium nitride layer and GaN layer are formed under process conditions selected such that the aluminum gallium nitride and GaN layers are under compressive strain due at least in part to defects in the aluminum gallium nitride and GaN layers. The aluminum gallium nitride and GaN layers in some cases are under compressive strain at a growth temperature that is elevated with respect to room temperature. The density of defects is selected to generate a predetermined level of compressive strain. In some cases, the defect density is between about $1 \times 10^8$ cm$^{-2}$ and $2 \times 10^{10}$ cm$^{-2}$. In other examples, process conditions are selected such that a buffer layer having AlN, aluminum gallium nitride and GaN layers is under compressive strain at a growth temperature, due at least in part to defects in the buffer layer. In some situations, the defect density in the buffer layer (including the individual layers) is between about $1 \times 10^8$ cm$^{-2}$ and $2 \times 10^{10}$ cm$^{-2}$.

Various source gases (or precursors) may be used with methods described herein. A gallium precursor may include trimethylgallium (TMG), triethylgallium, diethylgallium chloride and coordinated gallium hydride compounds (e.g., dimethylgallium hydride). An aluminum precursor may include tri-isobutyl aluminum (TIBAL), trimethyl aluminum (TMA), triethyl aluminum (TEA), and dimethylaluminum hydride (DMAH). An indium precursor may include trimethyl indium (TMI) and triethyl indium (TEI). A nitrogen precursor may include ammonia (NH$_3$), nitrogen (N$_2$), and plasma-excited species of ammonia and/or N$_2$. A p-type dopant precursor may be selected from a boron precursor (e.g., B$_2$H$_6$), a magnesium precursor (e.g., biscyclopentadienyl magnesium), an aluminum precursor, to name a few examples. An n-type precursor may be selected from a silicon precursor (e.g., SiH$_4$), a germanium precursor (e.g., tetramethylgermanium, tetraethylgermanium, dimethyl amino germanium tetrachloride, isobutylgermane) and a phosphorous precursor (e.g., PH$_3$), to name a few examples.

Figure 3:
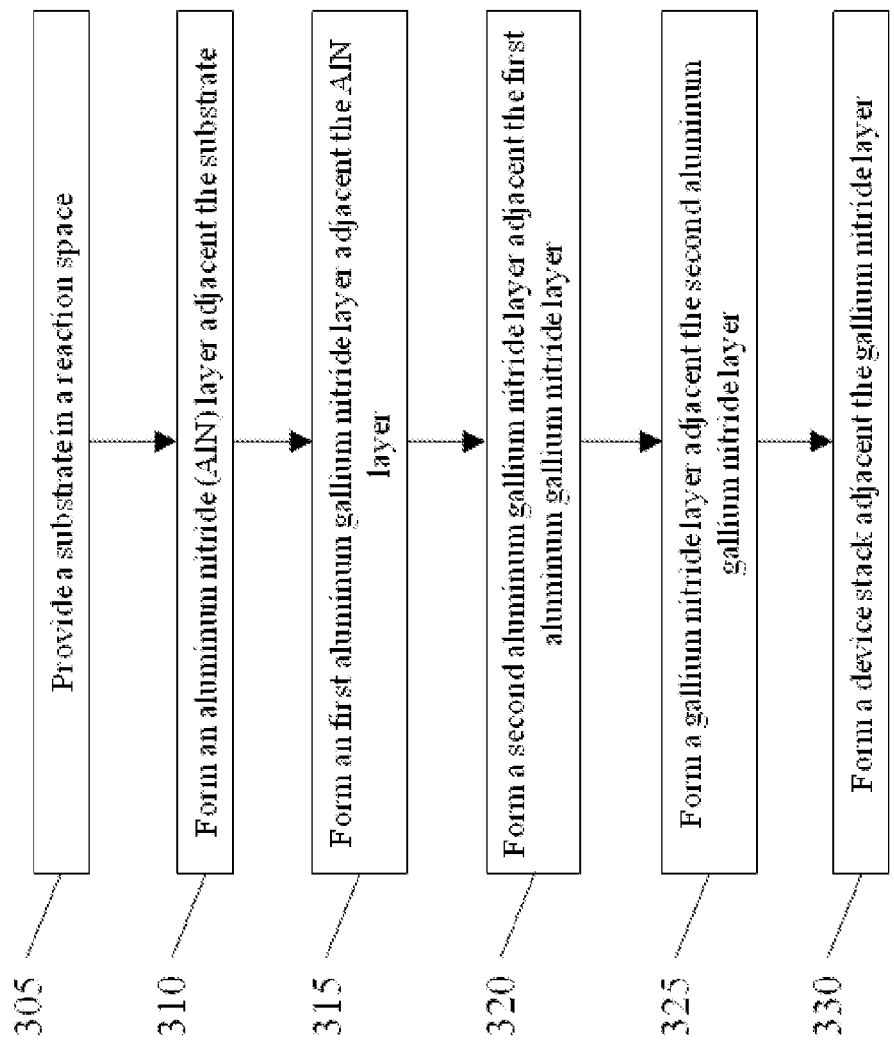
FIG. 3 schematically illustrates a method for forming a light emitting device, in accordance with an embodiment.

FIG. 3 shows a method 300 for forming a light emitting device, in accordance with an embodiment. In operation 305, a substrate is provided in a reaction chamber. The reaction chamber may be a vacuum chamber configured for thin film formation, such as with the aid of chemical vapor deposition (e.g., metal organic chemical vapor deposition, or MOCVD) or atomic layer deposition (ALD).

Next, in operation 310, an aluminum nitride (AlN) layer is formed adjacent to the substrate. The AlN layer is formed by heating the substrate to a growth temperature ranging between about 750° C. and 1200° C. in a reaction chamber with aluminum precursor and nitrogen precursor gas. In one embodiment, the growth temperature is set to be between about 900° C. and 1100° C. The aluminum precursor and the nitrogen precursor may be supplied into the reaction chamber with the aid of a carrier gas. The carrier gas may include hydrogen (H$_2$), argon, neon, and helium. In some embodiments, the reaction chamber includes both aluminum precursor and nitrogen precursor gas at the same time so that the substrate is exposed to the aluminum precursor and the nitrogen precursor simultaneously. In other embodiments, aluminum precursor gas and nitrogen precursor gas are provided into the reaction chamber in an alternating fashion so that the substrate is exposed to the aluminum precursor and the nitrogen precursor in an alternating fashion.

In some situations, during the formation of the AlN layer, one or more process parameters are selected such that the AlN layer as formed has a thickness selected to maintain tensile strain in the AlN layer at the growth temperature. In an example, the hydrogen flow rate and the one or both of the aluminum and nitrogen precursor flow rates are selected such that the AlN layer has a finite tensile strain at the growth temperature. The AlN layer in such a case has a predetermined defect density. In an example, the AlN layer has a defect density between about $1 \times 10^8$ cm$^{-2}$ and $2 \times 10^{10}$ cm$^{-2}$.

Next, in operation 315, with the substrate at the growth temperature, a first aluminum gallium nitride layer is formed adjacent to the AlN layer, the first aluminum gallium nitride layer having the composition $Al_xGa_{1-x}N$, wherein 'x' is a number between 0 and 1. The first aluminum gallium nitride layer is formed by exposing the AlN layer to an aluminum precursor (e.g., TMA), a gallium precursor (e.g., TMG) and a nitrogen precursor (e.g., $NH_3$). The partial pressure and flow rate of each of the precursors is selected to provide a desirable aluminum and gallium content. In some cases, the first aluminum gallium nitride layer is compositionally graded in aluminum and gallium (i.e., the aluminum and gallium content of the first aluminum gallium nitride layer varies along the direction of growth). In some situations, process parameters (e.g., carrier gas flow rate, precursor flow rates) are selected such that the first aluminum gallium nitride layer has a net compressive strain at the growth temperature. Without a proper selection of the growth conditions, the AlGaN layer can relax quickly and the overall stress of the grown layers may level out. Conventionally, relaxed layers may be desirable because new layers grown on such relaxed layers are free of strain and may be of higher crystal quality. However, a layer free of compressive stress (or strain) at a growth temperature may not be desirable upon cool-down to room temperature. In some cases, layers that are otherwise free of compressive strain at a growth temperature have strain (e.g., tensile strain) at or near room temperature, leading to bowing and in some cases cracking.

Next, in operation 320, with the substrate at the growth temperature, a second aluminum gallium nitride layer is formed adjacent to the first aluminum gallium nitride layer, the second aluminum gallium nitride layer having the composition $Al_yGa_{1-y}N$, wherein 'y' is a number between 0 and 1. The second aluminum gallium nitride layer is formed by exposing the first aluminum gallium nitride layer to an aluminum precursor, a gallium precursor and a nitrogen precursor. The partial pressure and flow rate of each of the precursors is selected to provide a desirable aluminum and gallium content. In some cases, the second aluminum gallium nitride layer is compositionally graded in aluminum and gallium (i.e., the aluminum and gallium content of the first aluminum gallium nitride layer varies along the direction of growth). In some situations, process parameters (e.g., carrier gas flow rate, precursor flow rates) are selected such that the second aluminum gallium nitride layer has a net compressive strain at the growth temperature.

Next, in operation 325, with the substrate at the growth temperature, a gallium nitride (GaN) layer is formed adjacent to the second aluminum gallium nitride layer. The GaN layer is formed by supplying into the reaction chamber a gallium precursor (e.g., TMG) and a nitrogen precursor (e.g., $NH_3$), and exposing the second aluminum gallium nitride layer to the gallium precursor and the nitrogen precursor. In some situations, process parameters (e.g., carrier gas flow rate, precursor flow rates) are selected such that the gallium nitride layer has a net compressive strain at the growth temperature.

In some cases, the second aluminum gallium nitride layer is precluded. In such cases, the GaN layer is formed adjacent to the first aluminum gallium nitride layer.

Next, in operation 330, a device stack is formed adjacent to the GaN layer. In some cases, the device stack includes an n-type gallium nitride (n-GaN) layer adjacent to the GaN layer formed in operation 325, an active layer adjacent to the n-GaN layer, and a p-type gallium nitride (p-GaN) layer adjacent to the active layer. In some embodiments, the GaN layer is exposed to a gallium precursor (e.g., TMG), a nitrogen precursor (e.g., $NH_3$) and a precursor of an n-type dopant (e.g., silane) to form the n-GaN layer. The n-GaN layer in some cases is formed at a growth temperature ranging between about 750° C. and 1100° C. In some embodiments, the growth temperature ranges between about 800° C. and 1050° C. In other embodiments, the growth temperature ranges between about 850° C. and 1000° C.

The active layer is then formed adjacent to the n-GaN layer. In some cases, the active layer is formed of one or more well layers (e.g., indium gallium nitride, aluminum gallium nitride, aluminum indium gallium nitride) and one or more barrier layers (e.g., gallium nitride) layers, with the well layers and barrier layers distributed in an alternating configuration. For instance, with the well layer formed of indium gallium nitride, the well layer is formed by supplying an indium precursor (e.g., TMI), a gallium precursor (e.g., TMG) and a nitrogen precursor (e.g., $NH_3$) into the reaction chamber. As another example, a well layer having aluminum gallium nitride is formed by supplying an aluminum precursor (e.g., TMA), a gallium precursor (e.g., TMG) and a nitrogen precursor (e.g., $NH_3$) into the reaction chamber.

One or a plurality of well layers may be separated with barrier layers, such as barrier layers having gallium nitride. In an example, a gallium nitride barrier layer is formed by supplying into the reaction chamber a gallium precursor and a nitrogen precursor. The active layer is formed to have a predetermined period of well-barrier stacks. In an example, the active layer has 1, or 2, or 3, or 4, or 5, or 6, or 7, or 8, or 9, or 10, or more periods of well-barrier stacks. In an example, the active layer is a multiple quantum well (MQW) active layer having, for example, 10 or more periods.

In some cases, the quantum well ("well") layer is formed at temperatures ranging between about 750° C. and 790° C. In some embodiments, the well is formed at temperatures ranging between about 770° C. and 780° C. The barrier layer may be formed at temperatures ranging between about 790° C. and 850° C. In some embodiments, the barrier layer is formed at temperatures ranging between about 810° C. and 840° C.

The p-GaN layer is then formed adjacent to the active layer. In some cases, the p-GaN layer is formed by supplying a gallium precursor (e.g., TMG), a nitrogen precursor (e.g., $NH_3$) and a precursor of a p-type dopant (e.g., biscyclopentadienyl magnesium, or Cp2Mg) into the reaction chamber. The p-GaN layer in some cases is formed at a temperature ranging between about 700° C. and 1100° C. In some embodiments, the temperature ranges between about 800° C. and 1050° C., while in other embodiments the temperature ranges between about 850° C. and 1000° C.

Next, a second substrate may be provided adjacent to the p-GaN layer. The second substrate may be a silicon substrate. In some cases, one or more intervening layers are formed prior to providing the second substrate. The substrate adjacent to the AlN layer may then be removed to expose the AlN layer.

In some embodiments, a first electrode is formed that is in electrical communication with the n-GaN layer and a second electrode is formed that is in electrical communication with the p-GaN layer. In other embodiments, the first electrode, as formed, is in contact with the n-GaN layer and the second electrode, as formed, is in contact with the second substrate (adjacent to the p-GaN layer). The first electrode may include one or more elemental metals such as titanium, aluminum, nickel, platinum, gold, silver, rhodium, copper, chromium, or combinations thereof. The second electrode may include one or more elemental metals such as aluminum, titanium, chromium, platinum, nickel, gold, rhodium, silver, or combinations, thereof.

The light emitting device formed according to the method 300 may have reduced strain at room temperature. In some cases, the formation of the buffer layer, per operations 305-325, provides a compressive strain that balances the tensile strain in the buffer layer, thereby reducing bowing and in some cases crack formation in the buffer layer and/or the device stack at room temperature.

Figure 4:
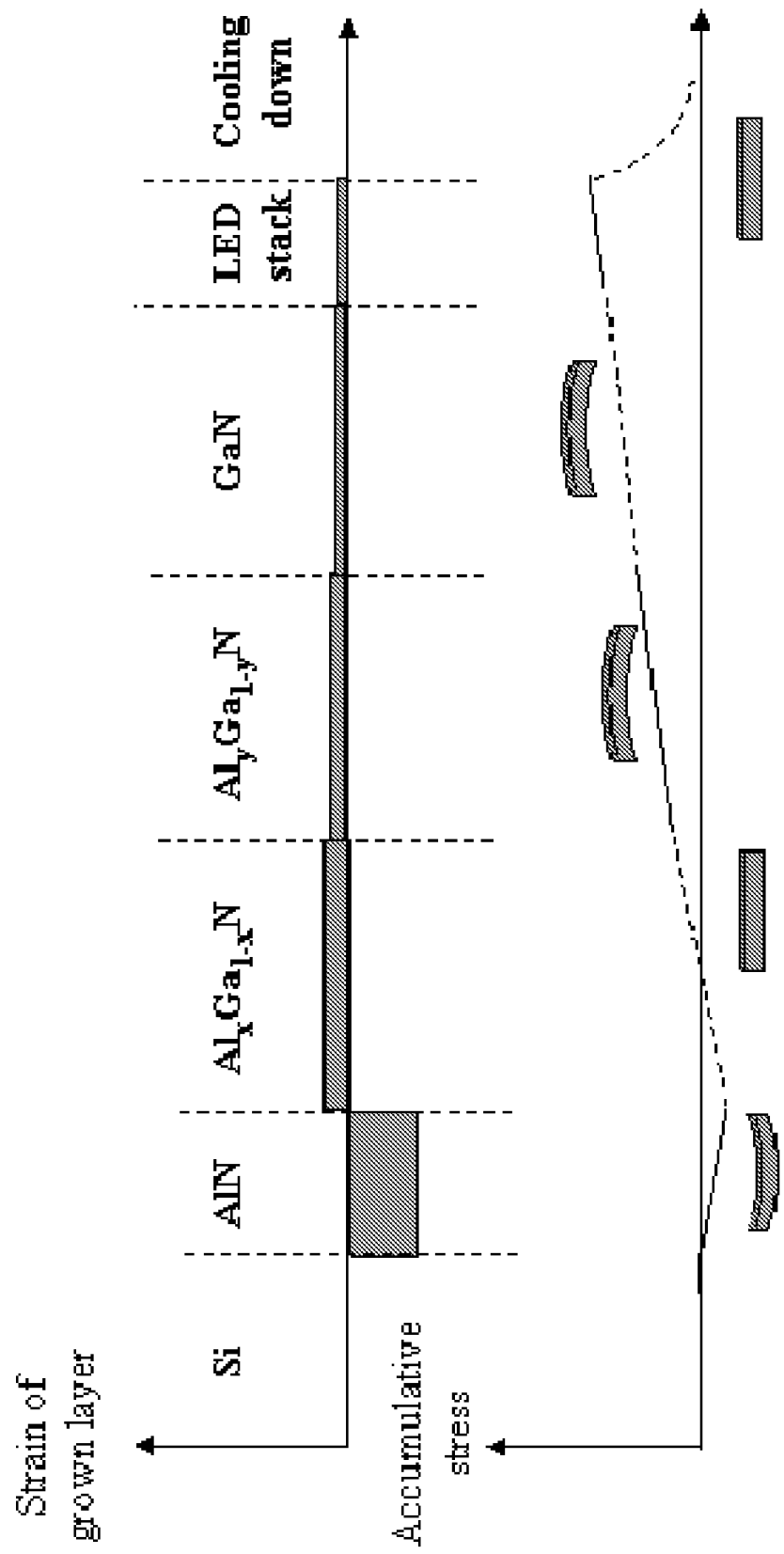
FIG. 4 schematically illustrates the strain and accumulated stress on a light emitting device at various stages of formation of a buffer layer over a silicon substrate, in accordance with an embodiment.

FIG. 4 schematically illustrates the strain and accumulated stress on a light emitting device at various stages of growth of a buffer layer over a silicon substrate of a light emitting device, in accordance with an embodiment. The y-axis schematically illustrates the strain and accumulative stress in the buffer layer at various stages of growth of the buffer layer. The shaded rectangles (top) show the relative strain in each layer, and the layer schematics (bottom) show the degree of bowing of the buffer layer at various stages of growth. The x-axis shows film thickness. The buffer layer, which is formed on a silicon substrate, includes an aluminum nitride (AlN) layer adjacent to the silicon substrate, a first aluminum gallium nitride ($Al_xGa_{1-x}N$) layer adjacent to the AlN layer, a second aluminum gallium nitride ($Al_yGa_{1-y}N$) layer adjacent to the first aluminum gallium nitride layer, and a gallium nitride layer adjacent to the second aluminum gallium nitride layer. Upon the formation of each layer, the buffer layer of the light emitting device is strained by selecting one or more process parameters to effect strain in the layer—that is, each layer is formed to have a predetermined level of strain.

In some embodiments, the AlN is provided to aid in the formation of the gallium-containing layers. AlN may minimize or eliminate the formation of a gallium-silicon alloy adjacent to the silicon substrate.

In some cases, the buffer layer is formed at a growth temperature. In other cases, the various layers of the buffer layer are formed at the same growth temperature or different growth temperatures.

With continued reference to FIG. 4, the AlN layer is formed such that the buffer layer is under tensile strain. The light emitting device following the formation of the AlN layer bows (or is concave). The $Al_xGa_{1-x}N$ layer is formed on the AlN layer under process conditions selected such that the tensile strain in the buffer layer is balanced by compressive strain in the $Al_xGa_{1-x}N$ layer. The light emitting device in such a case is under minimal strain at the growth temperature. The $Al_yGa_{1-y}N$ layer is formed on the $Al_xGa_{1-x}N$ layer under process conditions selected such that the $Al_yGa_{1-y}N$ layer is under compressive strain. The light emitting device is under compressive strain. The light emitting device in such a case is convex—the compressive strain in the buffer layer is greater than the tensile strain. The GaN layer is formed on the $Al_xGa_{1-x}N$ layer under process conditions selected such that the GaN layer is under compressive strain. In some embodiments, each layer of the buffer layer is formed to have a defect density between about $1\times10^8$ cm$^{-2}$ and $2\times10^{10}$ cm$^{-2}$.

Following the formation of the GaN layer, a light emitting diode device stack ("LED device stack") is formed. The LED device stack is configured to generate light upon the recombination of electrons and holes. The device stack comprises an n-GaN layer, a p-GaN layer and an active layer between the n-GaN layer and the p-GaN. The device stack in some cases is formed to have a defect density between about $1\times10^8$ cm$^{-2}$ and $2\times10^9$ cm$^{-2}$.

During the formation of the AlN layer, the buffer layer has a negative strain. During the formation of subsequent layers, the strain in the buffer layer increases. The slope of the plot of FIG. 4 (strain divided by thickness) is nearly or substantially constant. In some embodiments, the strain of the buffer layer at various stages of growth, when divided by thickness, is nearly or substantially constant.

With continued reference to FIG. 4, in some situations, process conditions are selected such that the thickness of various layers of the buffer layer and the light emitting device are within a predetermined limit. In some embodiments, during the formation of the light emitting diode, process conditions are selected such that the light emitting diode, as formed, has a thickness that is less than or equal to about 5 μm, or less than or equal to about 4 μm, or less than or equal to about 3 micrometers ("μm"). In some embodiments, during the formation of the AlN layer, process conditions are selected such that a thickness of the AlN layer, as formed, is less than or equal to about 1 μm. In some embodiments, the thickness of the AlN layer is less than or equal to about 0.5 μm, while in other embodiments the thickness of the AlN layer is than or equal to about 0.3 μm. In some embodiments, during the formation of the $Al_xGa_{1-x}N$ and $Al_yGa_{1-y}N$ layers, process conditions are selected such that a combined thickness of the $Al_xGa_{1-x}N$ and $Al_yGa_{1-y}N$ layers, as formed, is less than or equal to about 1 μm. In other embodiments, the combined thickness is less than or equal to about 0.8 μm, while in other embodiments the combined thickness is less than or equal to about 0.7 μm. In some embodiments, during the formation of the GaN layer, process conditions are selected such that a thickness of the GaN layer is less than or equal to about 4 μm. In other embodiments, the thickness of the GaN layer is less than or equal to about 3 μm, while in other embodiments the thickness of the GaN layer is less than or equal to about 2.5 μm. In some embodiments, during the formation of the buffer layer, process conditions are selected such that a thickness of the buffer layer, as formed, is less than or equal to about 5 μm. In other embodiments, the thickness of the buffer layer is less than or equal to about 4 μm, while in other embodiments the thickness of the buffer layer is less than or equal to about 3 μm. Process conditions, which are used to control these thicknesses, include one or more of growth temperature, precursor flow rate, carrier gas (e.g., $H_2$ gas) flow rate, reaction chamber pressure, growth rate and susceptor (or platten) rotation rate.

With continued reference to FIG. 4, each layer may have a different amount of strain. In some cases, however, during the formation of an individual layer, the strain in the individual layer as a function of the thickness of the individual layer is constant.

FIG. 5 shows a method for forming a buffer layer, in accordance with an embodiment. The buffer layer is part of a light emitting device, which may be a nascent light emitting device. Initially, an AlN layer is formed on a substrate under process conditions selected such that the AlN layer, as formed, has a predetermined level of strain. The strain in some cases is tensile strain. In an embodiment, the AlN layer is formed to have a defect density between about $1\times10^8$ cm$^{-2}$ and $2\times10^{10}$ cm$^{-2}$. The AlN layer in such a case is under tensile strain at the growth temperature; the nascent light emitting device, comprising the AlN layer and the substrate, bows (or is concave). In some situations, the substrate is a silicon-containing substrate, such as a substrate having a predominantly silicon content (e.g., Si(111)).

Next, an aluminum gallium nitride layer is formed on the AlN layer under process conditions selected such that the aluminum gallium nitride layer, as formed, has a compressive strain that balances the tensile strain in the nascent light emitting device. In some cases, the aluminum gallium nitride layer is formed to have a defect density between about $1 \times 10^8$ cm$^{-2}$ and $2 \times 10^{10}$ cm$^{-2}$. At the growth temperature, the nascent light emitting in such a case does not bow and is thus neither concave nor convex.

Next, a GaN layer is formed on the aluminum gallium nitride layer under process conditions selected such that the GaN layer, as formed, has a compressive strain. The nascent light emitting device in such a case has a net compressive strain at the growth temperature. In some cases, the GaN layer is formed to have a defect density ranging between about $1 \times 10^8$ cm$^{-2}$ and $2 \times 10^{10}$ cm$^{-2}$. The light emitting device in such a case is convex. Following cool-down to room temperature, the nascent light emitting device has little to no net strain (i.e., the compressive strain balances the tensile strain).

At the growth temperature, additional layers may be formed on the buffer layer. In an example, a light emitting stack is formed on the GaN layer, the light emitting stack having an n-GaN layer, a p-GaN layer and an active layer between the n-GaN layer and the p-GaN layer.

In some embodiments, during the formation of various device layers, the substrate is exposed to two or more precursor simultaneously. In other situations, during the formation of various device layers, the substrate is exposed to the various precursors an alternating and sequential fashion. In an example, a gallium nitride layer is formed by exposing a substrate to a gallium precursor (e.g., TMG) and followed by a nitrogen precursor (e.g., NH$_3$), with an intervening purging or evacuation operation. Generally, if a plurality of precursor are required to fin in a device layer, the precursor may be supplied into the reaction chamber simultaneously or in an alternating and sequential fashion.

Device layers may be formed using various deposition techniques. In some embodiments, device layers are formed using chemical vapor deposition (CVD), atomic layer deposition (ALD), plasma enhanced CVD (PECVD), plasma enhanced ALD (PEALD), metal organic CVD (MOCVD), hot wire CVD (HWCVD), initiated CVD (iCVD), modified CVD (MCVD), vapor axial deposition (VAD), outside vapor deposition (OVD), physical vapor deposition (e.g., sputter deposition, evaporative deposition).

While methods and structures provided herein have been described in the context of light emitting devices having Group III-V semiconductor materials, such as, for example, gallium nitride, such methods and structures may be applied to other types of semiconductor materials. Methods and structures provided herein may be used with light emitting devices formed at least in part of gallium nitride (GaN), gallium arsenide (GaAs), aluminum gallium arsenide (AlGaAs), gallium arsenide phosphide (GaAsP), aluminum gallium indium phosphide (AlGaInP), gallium phosphide (GaP), indium gallium nitride (InGaN), aluminum gallium phosphide (AlGaP), zinc selenide (ZnSe), aluminum nitride (AlN), aluminum gallium nitride (AlGaN), and aluminum gallium indium nitride (AlGaInN).

Systems Configured to Form Light Emitting Devices

In another aspect of the invention, a system for forming a light emitting device comprises a reaction chamber for holding a substrate, a pumping system in fluid communication with the reaction chamber, the pumping system configured to purge or evacuate the reaction chamber, and a computer system having a processor for executing machine readable code implementing a method for forming the light emitting device. The code may implement any of the methods provided herein. In an embodiment, the code implements a method comprising forming a plurality of layers adjacent to a silicon substrate, the plurality of layers including i) an aluminum nitride layer adjacent to the silicon substrate, ii) an aluminum gallium nitride layer adjacent to the aluminum nitride layer and iii) a gallium nitride layer adjacent to the aluminum gallium nitride layer. During the formation of each of the plurality of layers, one or more process parameters are selected such that an individual layer of the plurality of layers has a tensile strain or compressive strain that is nonzero with increasing thickness of the individual layer. In another embodiment, the code implements a method comprising (a) providing a substrate in a reaction chamber, (b) forming an aluminum nitride (AlN) layer adjacent to the substrate under processing conditions selected to generate defects (e.g., dislocations) in the AlN layer, (c) forming an aluminum gallium nitride layer adjacent to the AlN layer under processing conditions selected to generate (or form) defects in the aluminum gallium nitride layer, and (d) forming a gallium nitride (GaN) layer adjacent to the aluminum gallium nitride layer under processing conditions selected to generate defects in the GaN layer. The defects induce strain (i.e., compressive strain or tensile strain) in each of the layers. In some embodiments, processing conditions are selected to generate and maintain a predetermined density of defects, such as, e.g., a defect density between about $1 \times 10^8$ cm$^{-2}$ and $2 \times 10^{10}$ cm$^{-2}$.

Figure 6:
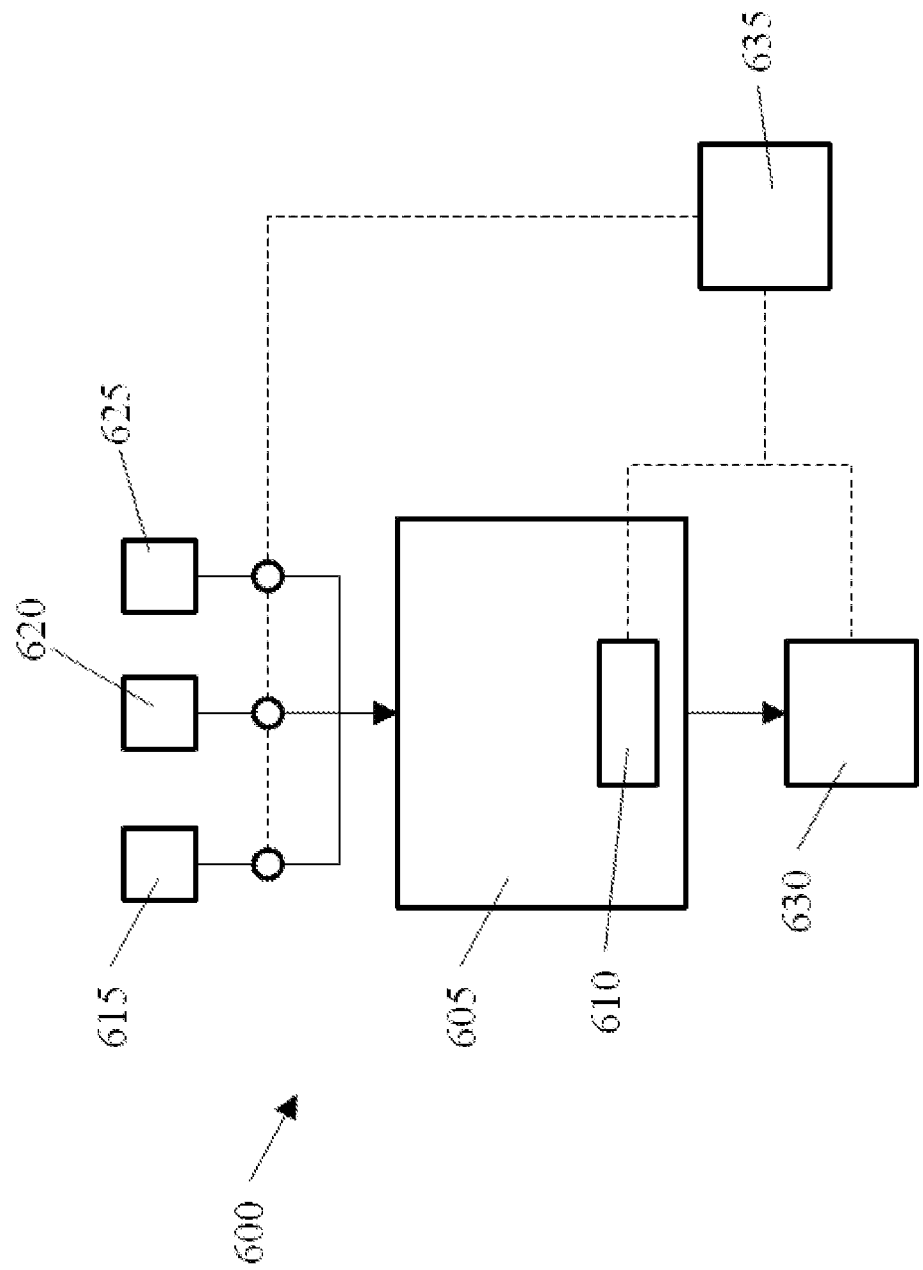
FIG. 6 shows a system used to fabricate a light emitting device, in accordance with an embodiment.

FIG. 6 shows a system 600 for forming a light emitting device, in accordance with an embodiment. The system 600 includes a reaction chamber 605 having a susceptor (or substrate holder) 610 configured to hold a substrate that is used to form the light emitting device. The system comprises a first precursor storage vessel (or tank) 615, a second precursor storage vessel 620, and a carrier gas storage tank 625. The first precursor storage vessel 615 may be for holding a Group III precursor (e.g., TMG) and the second precursor storage vessel 620 may be for holding a Group V precursor (e.g., NH$_3$). The carrier gas storage tank 625 is for holding a carrier gas (e.g., H$_2$). The system 600 may include other storage tanks or vessels, such as for holding additional precursors and carrier gases. The system 600 includes valves between the storage vessels and the reaction chamber 605 for fluidically isolating the reaction chamber 605 from each of the storage vessels.

The system 600 further includes a vacuum system 630 for providing a vacuum to the reaction chamber 605. The vacuum system 630 is in fluid communication with the reaction chamber 605. In some cases, the vacuum system 630 is configured to be isolated from the reaction pace 605 with the aid of a valve, such as a gate valve.

A controller (or control system) 635 of the system 600 facilitates a method for forming a light emitting device in the reaction chamber 605, such as forming one or more layers of the light emitting device. The controller 635 is communicatively coupled to a valve of each of the first precursor storage vessel 615, the second precursor storage vessel 620, the carrier gas storage tank 625 and the vacuum system 630. The controller 635 is operatively coupled to the susceptor 610 for regulating the temperature of the susceptor and a substrate on the susceptor, and the vacuum system 630 for regulating the pressure in the reaction chamber 605.

In some situations, the vacuum system 630 includes one or more of a turbomolecular ("turbo") pump, a diffusion pump and a mechanical pump. In some cases, the vacuum system 630 includes a turbo pump, diffusion pump and/or mechanical pump. A pump may include one or more backing pumps. For example, a turbo pump may be backed by a mechanical pump.

In some embodiments, the controller 635 is configured to regulate one or more processing parameters, such as the substrate temperature, precursor flow rates, growth rate, carrier gas flow rate and reaction chamber pressure. The controller 635, in some cases, is in communication with valves between the storage vessels and the reaction chamber 605, which aids in terminating (or regulating) the flow of a precursor to the reaction chamber 605. The controller 635 includes a processor configured to aid in executing machine-executable code that is configured to implement the methods provided herein. The machine-executable code is stored on a physical storage medium, such as flash memory, a hard disk, or other physical storage medium configured to store computer-executable code.

In some embodiments, the controller 635 is configured to regulate one or more process parameters. In some situations, the controller 635 regulates the growth temperature, carrier gas flow rate, precursor flow rate, growth rate and/or growth pressure (or reaction chamber pressure).

In some situations, the controller 635 is configured to regulate process parameters such that one or more layers of a light emitting device are strained. For instance, the controller 635 regulates one or more of the growth temperature, the precursor flow rate the carrier gas flow rate, reaction chamber pressure, and growth rate to generate a predetermined level of strain in one or more layers of a buffer layer of a nascent or completed light emitting device.

In some embodiments, the system 600 includes various surface or bulk analytical instruments (spectroscopies) for qualitatively and/or quantitatively analyzing a substrate and various layers formed over the substrate. In some cases, the system includes a deflectometer for measuring the curvature of the substrate or a thin film formed on the substrate. The curvature in some cases is related to the stress in the substrate or the thin film (e.g., a thin film under stress is concave or convex).

EXAMPLE

A silicon substrate is provided on a susceptor in a reaction chamber and a dislocation density maintaining buffer layer is formed on the silicon substrate. The dislocation density maintaining buffer layer includes an aluminum nitride layer, an aluminum gallium nitride adjacent to the AlN layer, and a gallium nitride layer adjacent to the aluminum gallium nitride layer.

With the susceptor at a temperature of about 850° C., the buffer layer is formed by exposing the silicon substrate to TMA and $NH_3$ to form the AlN layer on the silicon substrate. The AlN layer has a thickness of about 0.4 micrometer ("μm"). Next, with the susceptor at a temperature of about 850° C., the AlN layer is exposed to TMA, TMG and $NH_3$ to form an aluminum gallium nitride layer on the AlN layer. The aluminum gallium nitride has a thickness of about 0.7 μm. Next, with the susceptor at a temperature of about 850° C., the aluminum gallium nitride layer is exposed to TMG and $NH_3$ to form a GaN layer at a thickness of about 2.5 μm. At the growth temperature, the substrate has a radius of curvature (absolute value) of about 5 m. Upon cool down to room temperature, the substrate has a radius of curvature (absolute value) greater than 50 m.

Unless the context clearly requires otherwise, throughout the description and the claims, words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A method for forming a light emitting device, comprising:
   forming a buffer layer on a substrate at a growth temperature, the buffer layer comprising an aluminum gallium nitride (AlGaN) layer and a gallium nitride (GaN) layer, wherein, at the growth temperature, a tensile strain is generated in the buffer layer; and
   forming a light emitting stack on the buffer layer, the light emitting stack including an active layer configured to generate light upon the recombination of electrons and holes,
   wherein at least one layer of the light emitting stack and the buffer layer has a first coefficient of thermal expansion higher than a second coefficient of thermal expansion of the substrate, and
   a growth condition for forming the buffer layer is selected to generate a compressive strain in the buffer layer during cool-down to a room temperature to counterbalance the tensile strain generated between the buffer layer and the substrate so that the light emitting device has a radius of curvature (absolute value) that is greater than 50 m.

2. The method of claim 1, wherein the growth condition for forming the buffer layer is selected to form the buffer layer so as to have a defect density between $1 \times 10^8$ cm$^{-2}$ and $2 \times 10^{10}$ cm$^{-2}$.

3. The method of claim 1, wherein, during the cool-down to the room temperature, the substrate contracts at a lower rate than the buffer layer.

4. The method of claim 1, wherein the substrate is a silicon substrate.

5. The method of claim 1, wherein the buffer layer further comprises an aluminum nitride (AlN) layer formed between the AlGaN layer and the substrate.

6. The method of claim 5, wherein the GaN layer is formed between the AlGaN layer and the light emitting stack.

7. The method of claim 1, wherein the combined thickness of the buffer layer and the light emitting stack is less than or equal to 5 μm.

8. The method of claim 1, wherein the combined thickness of the buffer layer and the light emitting stack is less than or equal to 3 μm.

9. A method for forming a light emitting device, comprising:
forming a buffer layer on a substrate at a growth temperature, the buffer layer comprising an aluminum gallium nitride (AlGaN) layer and a gallium nitride (GaN) layer, wherein, at the growth temperature, a tensile strain is generated in the buffer layer; and
forming a light emitting stack on the buffer layer, the light emitting stack including an active layer configured to generate light upon the recombination of electrons and holes,
wherein at least one layer of the light emitting stack and the buffer layer has a first coefficient of thermal expansion higher than a second coefficient of thermal expansion of the substrate, and
a growth condition for forming the buffer layer is selected to generate a compressive strain in the buffer layer during cool-down to a room temperature to counterbalance the tensile strain generated between the buffer layer and the substrate.

10. The method of claim 9, wherein the growth condition for forming the buffer layer is selected to form the buffer layer so as to have a defect density between $1 \times 10^8$ cm$^{-2}$ and $2 \times 10^{10}$ cm$^{-2}$.

11. The method of claim 9, wherein, during the cool-down to the room temperature, the substrate contracts at a lower rate than the buffer layer.

12. The method of claim 9, wherein the substrate is a silicon substrate.

13. The method of claim 9, wherein the buffer layer further comprises an aluminum nitride (AlN) layer formed between the AlGaN layer and the substrate.

14. The method of claim 13, wherein the GaN layer is formed between the AlGaN layer and the light emitting stack.

15. The method of claim 9, wherein the combined thickness of the buffer layer and the light emitting stack is less than or equal to 5 μm.

16. The method of claim 9, wherein the combined thickness of the buffer layer and the light emitting stack is less than or equal to 3 μm.

17. A method for forming a light emitting device, comprising:
forming an AlN layer on a substrate at a first growth temperature, wherein, at the first growth temperature, a tensile strain is generated in the AlN layer;
forming a first $Al_xGa_{1-x}N$ layer on the AlN layer at a second growth temperature, wherein 'x' is a number between 0 and 1, and, at the second growth temperature, a compressive strain is generated in the first $Al_xGa_{1-x}N$ layer;
forming a GaN layer on the first $Al_xGa_{1-x}N$ layer at a third growth temperature, wherein, at the third growth temperature, a compressive strain is generated in the GaN layer; and
forming a light emitting stack on the GaN layer, the light emitting stack having an n-type gallium nitride (n-GaN) layer, a p-type gallium nitride (p-GaN) layer, and an active layer between the n-GaN and p-GaN layers,
wherein the AlN layer, the first $Al_xGa_{1-x}N$ layer and the GaN layer forms a buffer layer,
at least one layer of the light emitting stack and the buffer layer has a first coefficient of thermal expansion higher than a second coefficient of thermal expansion of the substrate, and
a growth condition for forming the buffer layer is selected to generate a compressive strain in the buffer layer during cool-down to a room temperature to balance the strain generated between the buffer layer and the substrate.

18. The method of claim 17, wherein the growth condition for forming the buffer layer is selected to generate the compressive strain in the buffer layer during the cool-down to the room temperature to balance the strain generated between the buffer layer and the substrate so that the light emitting device has a radius of curvature (absolute value) that is greater than 50 m.

19. The method of claim 17, wherein, during the cool-down to the room temperature, the substrate contracts at a lower rate than the buffer layer.

20. The method of claim 17, wherein the growth condition for forming the buffer layer is selected to form the buffer layer so as to have a defect density between $1 \times 10^8$ cm$^{-2}$ and $2 \times 10^{10}$ cm$^{-2}$.

21. The method of claim 17, wherein, during the cool-down to the room temperature, the substrate contracts at a lower rate than the light emitting stack.

22. The method of claim 17, wherein the substrate is a silicon substrate.

23. The method of claim 17, wherein the combined thickness of the buffer layer and the light emitting stack is less than or equal to 5 μm.

24. The method of claim 17, wherein the combined thickness of the buffer layer and the light emitting stack is less than or equal to 3 μm.

25. The method of claim 17, further comprising forming a second $Al_yGa_{1-y}N$ layer on the first $Al_xGa1-xN$ layer, wherein 'y' is a number between 0 and 1.

* * * * *

UNITED STATES PATENT AND TRADEMARK OFFICE
CERTIFICATE OF CORRECTION

PATENT NO.         : 9,130,068 B2                                      Page 1 of 1
APPLICATION NO.    : 14/158401
DATED              : September 8, 2015
INVENTOR(S)        : Long Yang et al.

It is certified that error appears in the above-identified patent and that said Letters Patent is hereby corrected as shown below:

In the Specification:
At column 19, line number 39, delete "fin in" and replace with --form--.

In the Claims:
At column 24, claim number 25, line number 48, delete "$Al_xGa1-xN$" and replace with --$Al_xGa_{1-x}N$--.

Signed and Sealed this
Fifth Day of January, 2016

Michelle K. Lee
*Director of the United States Patent and Trademark Office*